US00H002171H

(19) United States

(12) Statutory Invention Registration

Adams, Jr. et al.

(10) Reg. No.: US H2171 H

(43) Published: Sep. 5, 2006

(54) METHOD AND APPARATUS FOR MODELING COSMIC RAY EFFECTS ON MICROELECTRONICS

(75) Inventors: James H. Adams, Jr., Huntsville, AL (US); Paul R. Boberg, Valencia, CA (US); Bruce A. Brownstein, Oxon Hill, MD (US); William F. Dietrich, Prospect Heights, IL (US); Erwin O. Flueckiger, Bern (CH); Edward L. Petersen, Fairfax, VA (US); Margaret A. Shea, Nashua, NH (US); Don F. Smart, Nashua, NH (US); Edward C. Smith, Oceanside, CA (US); Allan J. Tylka, Silver Spring, MD (US)

(73) Assignee: The United States of America as represented by the Secretary of the Navy, Washington, DC (US)

(21) Appl. No.: 09/002,031

(22) Filed: Dec. 31, 1997

(51) Int. Cl.
*G06F 17/10* (2006.01)

(52) U.S. Cl. ..... 703/2; 703/6

(58) Field of Classification Search ..... 703/2, 703/6

See application file for complete search history.

(56) References Cited

PUBLICATIONS

Tylka et al.; CREME96: a revision of the Cosmic Ray Effects on Microelectronics code; IEEE Trans. Nuclear Science; pp. 2150–2160; Dec. 1997.*

"Cosmic Ray Effects on Microelectronics, Part I: The Near–Earth Particle Evironment," Adams, Jr. et al., NRL Memorandum Report 4506, Aug. 25, 1981.

"Cosmic Ray Effects on Microelectronics, Part II: The Geomagnetic Cutoff Effects," Adams, Jr. et al., NRL Memorandum Report 5099, May 26, 1983.

"Cosmic Ray Effects on Microelectronics, Part IV," James H. Adams Jr., NRL Memorandum Report 5901, Dec. 31, 1986.

(Continued)

*Primary Examiner*—Daniel Pihulic

(74) *Attorney, Agent, or Firm*—Thomas Robbins; John J. Karasek

(57) ABSTRACT

An aspect of the present invention is a method and apparatus for computing a geomagnetic transmission function. This apparatus includes a programmed digital computer running modeling software for modeling the transmission of cosmic ray particles through the magnetosphere. The software includes a model representing a solution to the Lorentz equation in a magnetic field given by $B=B_{IGRF}(r,t')+B_{TSYG}(Kp,r,t')$. Another aspect of the present invention is a method and apparatus for computing a flux of particles at the outer surface of a satellite comprising, inter alia, an improved method and apparatus for computing a flux of solar heavy ions. This apparatus includes a programmed digital computer running modeling software for modeling the flux of cosmic ray particles through the outer surface of a satellite. Another aspect of the invention is a method and apparatus comprising a programmed digital computer running modeling software for modeling the effect of cosmic rays on microelectronics, where this software embodies at least one of the two foregoing aspects of the invention.

13 Claims, 11 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

OTHER PUBLICATIONS

"CREME96: A Revision of the Cosmic Ray Effects on Micro–Electronics Code," Transactions on Nuclear Science 44(6) 2150–60, Tylka et al. (1997).

"A Magnetoshperic Magnetic Field Model with a Warped Tail Current Sheet," Planet. Space Sci. 37(1) 5–20, Tsyganenko (1989).

"Hourly Values of Equatorial Dst for the IGY," Ann. Int. Geophys. 9–45, Sugiura, M., 1964.

IAGA Bulletin 27, 1969, 123, resolution 2.

Bartels, J., "The Standard Index, Ks, and the Planetary Index, KP," IATME Bulletin 12b, 97 IUGG Pub. Office, Paris, 1949.

"A Model of Galactic Cosmic Ray Fluxes," Nucl. Tracks Radiat. Meas. 20 427, Nymmik et al. (1992).

* cited by examiner

CREME96 MAIN MENU

SEE BRIEF INSTRUCTION AT THE BOTTOM OF THIS PAGE. SEE HOW TO RUN CREME96 FOR MORE DETAILS

| GO | RESET FORM |
|---|---|

| ROUTINE | USER REQUEST FILE LIST | EDIT USER REQUEST FILE | RUN ROUTINE |
|---|---|---|---|
| TPS | ▼ | ○ | □ |
| GTRN | ▼ | ○ | □ |
| FLUX | ▼ | ○ | □ |
| TRANS | ▼ | ○ | □ |
| LETSPEC | ▼ | ○ | □ |
| PUP | ▼ | ○ | □ |
| HUP | ▼ | ○ | □ |
| UTILITIES (CREATE PLOTS, PERFORM DOWNLOADS, ETC.) | | | □ |

1. TO CREATE A USER REQUEST FILE:
   CLICK ON THE EDIT BUTTON BY THE CORRESPONDING ROUTINE, LEAVING THE USER REQUEST FILE BLANK. (IF NECESSARY, USE THE BLANK SPACE IN THE PULLDOWN MENU TO CLEAR A NAME ALREADY TYPED THERE.)
   CLICK ON THE "GO" BAR.

2. TO EDIT AN EXISTING USER REQUEST FILE:
   CLICK ON THE EDIT BUTTON BY THE CORRESPONDING ROUTINE.
   SELECT A USER REQUEST FILE FROM THE APPROPRIATE PULL-DOWN MENU.
   CLICK ON THE "GO" BAR.

3. TO RUN ONE OR MORE ROUTINES:
   IF AN EDIT BUTTON HAS BEEN CLICKED "ON", USE THE RESET BAR TO CLEAR IT.
   SELECT USER REQUEST FILE(S) FROM THE APPROPRIATE PULL-DOWN MENU(S).
   CLICK ON THE RUN BUTTON(S) IN THAT LINE(S).
   CLICK ON THE "GO" BAR.

4. TO ACCESS CREME96 UTILITIES:
   CLICK ON THE RUN BUTTON ON THAT LINE.
   CLICK ON THE "GO" BAR.

NOTE: YOU CAN CREATE OR EDIT ONLY ONE USER REQUEST FILE AT A TIME. BUT YOU CAN SUBMIT SEVERAL FILES FOR RUNNING (SEQUENTIALLY, IN THE ORDER SHOWN IN THE TABLE) BY CHECKING MORE THAN ONE "RUN" BUTTON AND THEN CLICKING ON THE "GO" BAR.

QUESTIONS? COMMENTS? SEND MAIL TO tylka@crs2.nrl.navy.mil.

YOU MAY TERMINATE YOUR CREME96 SESSION AT ANY TIME.

FIG. 10

METHOD AND APPARATUS FOR MODELING COSMIC RAY EFFECTS ON MICROELECTRONICS

BACKGROUND OF THE INVENTION

1. Field of the Invention

The present invention relates generally to a method and apparatus for modeling the effects of cosmic rays on microelectronics in earth orbit, and more particularly to an improved method and apparatus for modeling these effects, these improvements reflecting a simpler, easier way for the user to operate the model over the internet, and more accurate modeling of these effects.

2. Description of the Related Art

For electronic components onboard satellites in earth orbit, exposure to cosmic rays represents a serious risk, due to the capacity of cosmic rays to induce single event effects (SEE) in these components. See generally Sherra E. Kerns, *Transient-Ionization and Single-Event Phenomena*, in Ionizing Radiation Effects in MOS Devices and Circuits 485-91 (John Wiley & Sons, Inc., T. P. Ma et al. eds., 1989). In brief, SEEs occur when an energetic particle changes a particular device in an integrated circuit, thereby causing an error. To date, the only effective methods for hardening these circuits against SEEs have been shielding, redundancy, and error detection and correction (EDAC).

Unfortunately, these measures are not always effective, and the failure of a single component may lead to the total loss of a multi-million dollar satellite. With the potential loss associated with this risk so high it is desired to have a way to accurately predict the magnitude of this risk, as well as a way of predicting how successful ameliorative efforts are likely to be.

CREME (short for Cosmic Ray Effects on Microelectronics) was a software package developed by the Naval Research Laboratory in 1981 for modeling how a given electronic chip on a given satellite with a given orbit and amount of shielding would hold up against cosmic ray bombardment. See Cosmic Ray Effects on Microelectronics, Part I: The Near-Earth Particle Environment, Adams et al., NRL Memorandum Report 4506; Cosmic Ray Effects on Microelectronics Part II: The Geomagnetic Cutoff Effects, Adams et al., NRL Memorandum Report 5099; Cosmic Ray Effects on Miroelectronics, Part IV, Adams, NRL Memorandum Report 5901, each incorporated herein by reference, in their entireties, for all purposes. CREME had several shortcomings. It has been discovered that many of the predictions of CREME were inaccurate. Particular shortcomings of the original CREME software included its inaccurate modeling of the transmission of cosmic rays through earth's magnetosphere, and inaccurate modeling of the flux of heavy ions associated with solar flares.

Moreover, the implementation of this program was less than optimal, having a difficult user interface, and requiring each user to install, maintain, and run the software.

NOTE ON NOMENCLATURE USED HEREIN

Some portions of the following disclosure describe method elements such as determining, selecting, dividing, processing, computing, calculating, numerically integrating, applying a function, displaying, and the like, and structure elements such as tables, memories, internet connections, and the like. These descriptions are the means used by persons of ordinary skill in the art of data processing to most effectively convey the substance of their work to other skilled artisans. Such methods and structures are intended to describe methods and structures for carrying out a set of steps on at least one programmed digital computer to reach a desired result. Thus, each of these steps requires a physical manipulation of concrete quantities, generally in the form of electrical, optical, and magnetic signals capable of being stored, retrieved, combined, and otherwise manipulated in such a programmed digital computer.

Accordingly, unless indicated otherwise, skilled artisans will recognize that as used herein, terms such as determining, selecting, dividing, processing, computing, calculating, numerically integrating, applying a function, displaying, and the like, refer to the operations of a programmed digital computer system, or similar electronic computing device, that manipulates and transforms data represented as physical quantities within the computer.

SUMMARY OF THE INVENTION

Accordingly, it is an object of this invention to improve the modeling of the effects of cosmic rays on microelectronics.

It is a further object of this invention to improve the modeling of solar heavy ion flux.

It is a further object of this invention to improve the modeling of geomagnetic transmission.

It is a further object of this invention to improve the user interface, by implementing an internet-based interface, allowing users to access a world wide web site connected to a server where the software is installed and maintained.

These and additional objects of the invention are accomplished by the structures and processes hereinafter described.

As aspect of the present invention is a method and apparatus for computing a geomagnetic transmission function. This apparatus includes a programmed digital computer running modeling software for modeling the transmission of cosmic ray particles through the magnetosphere. The software includes a model representing a solution to the Lorentz equation in a magnetic field given by:

$$B=B_{IGRF}(r,t')+B_{TSYG}(KP,r,t')$$

where B is the earth's magnetic field, where $B_{IGRF}(r,t')$ is the International Geomagnetic Reference Field model of earth's magnetic field, a standard internationally recognized representation of earth's magnetic field, and where $B_{TSYG}(Kp,r,t')$ is the model of earth's magnetic field published by Tsyganenko in 1989, as modified by the inventors. $B_{IGRF}(r,t')$ and $B_{TSYG}(Kp,r,t')$ are discussed in further detail infra.

Another aspect of the present invention is a method and apparatus for computing a flux of particles at the outer surface of a satellite comprising, inter alia, an improved method and apparatus for computing a flux of solar heavy ions. This apparatus includes a programmed digital computer running modeling software for modeling the flux of cosmic ray particles through the outer surface of a satellite.

Another aspect of the invention is a method and apparatus comprising a programmed digital computer running modeling software for modeling the effect of cosmic rays on microelectronics, where this software embodies at least one of the two foregoing aspects of the invention.

Another aspect of the invention is a preferred embodiment of a method and apparatus comprising a programmed digital computer running modeling software for modeling the effect of cosmic rays on microelectronics, where this software embodies at least one of the two foregoing aspects of the invention, where this preferred embodiment is connected to a network, typically the internet, to permit remote users to use the invention.

BRIEF DESRIPTION OF THE DRAWINGS

A more complete appreciation of the invention will be obtained readily by reference to the following Description of the Preferred Embodiments and the accompanying drawings in which like numerals in different figures represent the same structures or elements, wherein.

Figure 8:
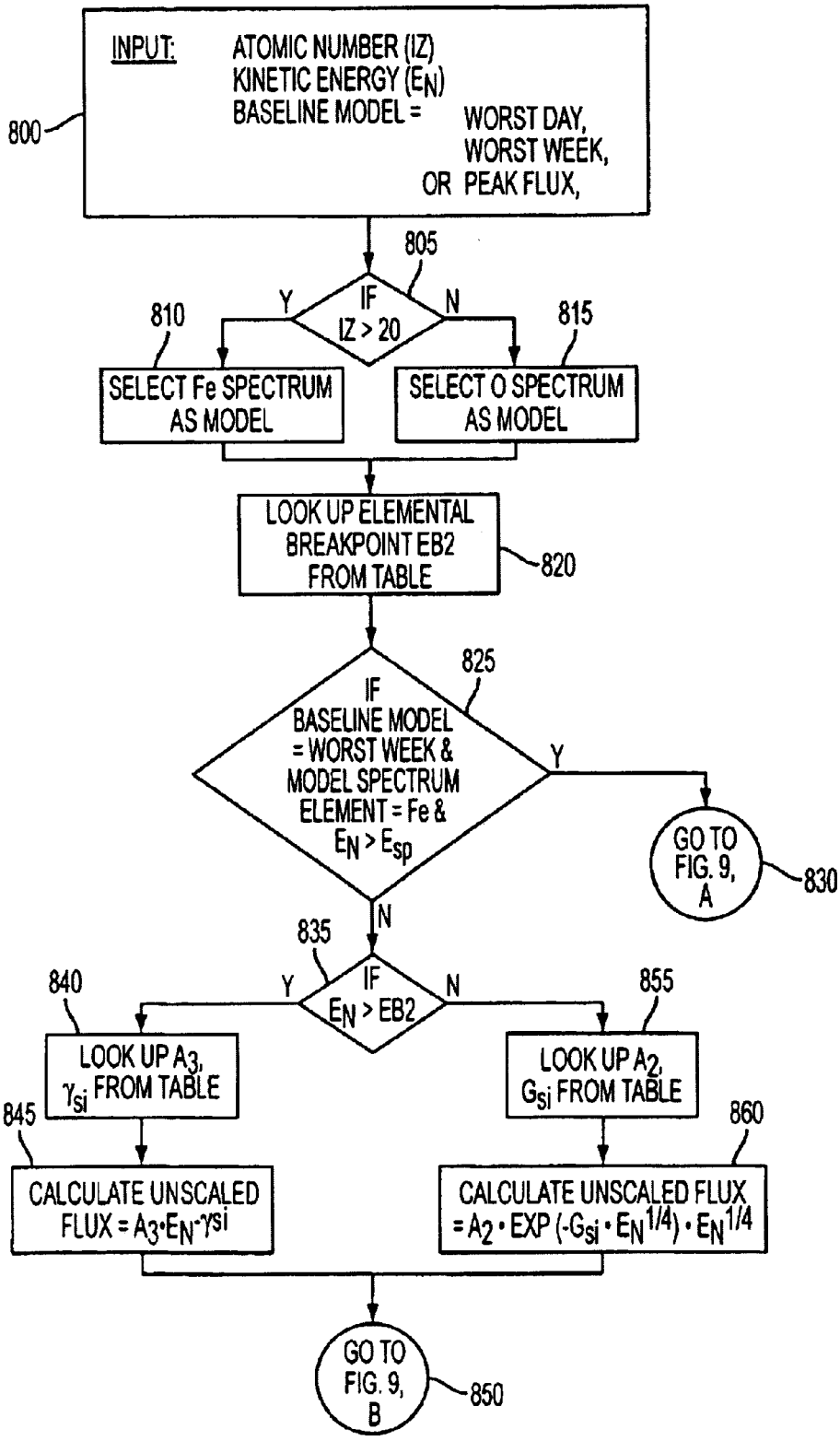
Figure 9:
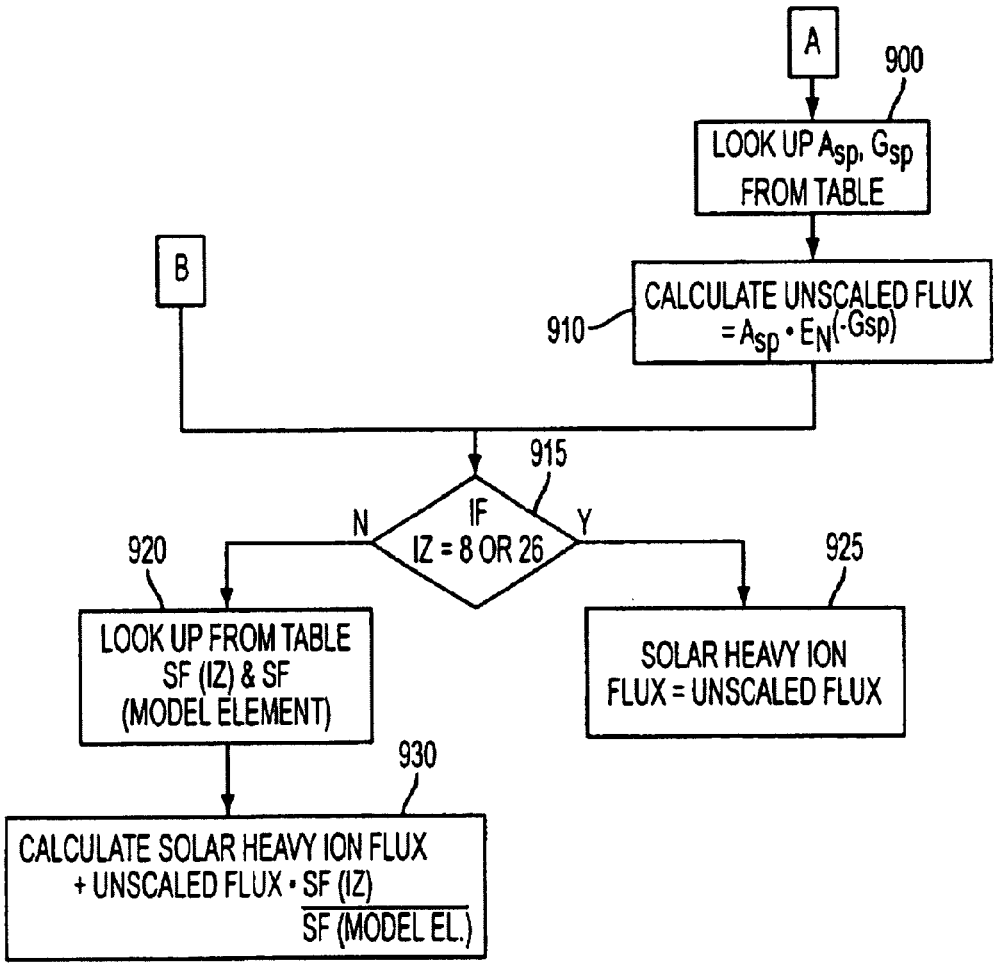

FIGS. 8 and 9 together are a flowchart for a method for modeling solar heavy ion flux according to the present invention.

FIG. 10 shows a main menu for a user to operate the preferred CREME96 software through the internet.

DETAILED DESCRIPTION OF THE PREFERRED EMBODIMENTS

The following are each incorporated herein by reference, in their entireties, for all purposes:

(A) "CREME96: A Revision of the Cosmic Ray Effects on Micro-Electronics Code", Transactions on Nuclear Science 44(6) 2150-60, Tylka et al. (1997);

(B) "A Magnetosphereic Magnetic Field Model with a Warped Tail Current Sheet", Planet. Space Sci. 37(1) 5-20, Tsyganenko (1989).

Overview

In a preferred embodiment, the invention comprises several computer software modules running on a powerful server computer. Although this computer may be operated in a standalone mode, it is preferred to have this server connected to a network (typically the internet), so that remote users can operate the software, and store their resulting data either locally on the server or remotely on their own or another machine.

Overall, the software will includee one or both of a geomagnetic transmission modeling module and a particle flux modeling module. Optionally, the software includes both of these modules, and also optionally the software includes one or more of several optional modules, including a shielding transport modeling module, a linear energy transfer modeling module, a proton-induced single event upset (SEU, a particular type of SEE, but unless noted otherwise used interchangeably herein with SEE) rate modeling module, and a direct ionization induced single event upset rate modeling module.

Examples of each of these modules have been produced, and will be discussed in greater detail below. The exemplary module for modeling geomagnetic transmission is referred to herein as GTRN. The exemplary module for modeling particle flux is referred to herein as FLUX. The exemplary module for modeling transport of particles through solid shielding is referred to herein as TRANS. The exemplary module for modeling linear energy transfer to a target structure (typically as integrated circuit) is referred to herein as LETSPEC. The exemplary module for modeling proton-induced SEU event upset rates in specified devices is referred to herein as PUP. The exemplary module for modeling SEU rates induced by direct ionization is referred to herein as HUP. Exemplary FORTRAN code for these exemplary modules appears infra. Together, the software for these exemplary modules is referred to herein as CREME96.

Figure 1:
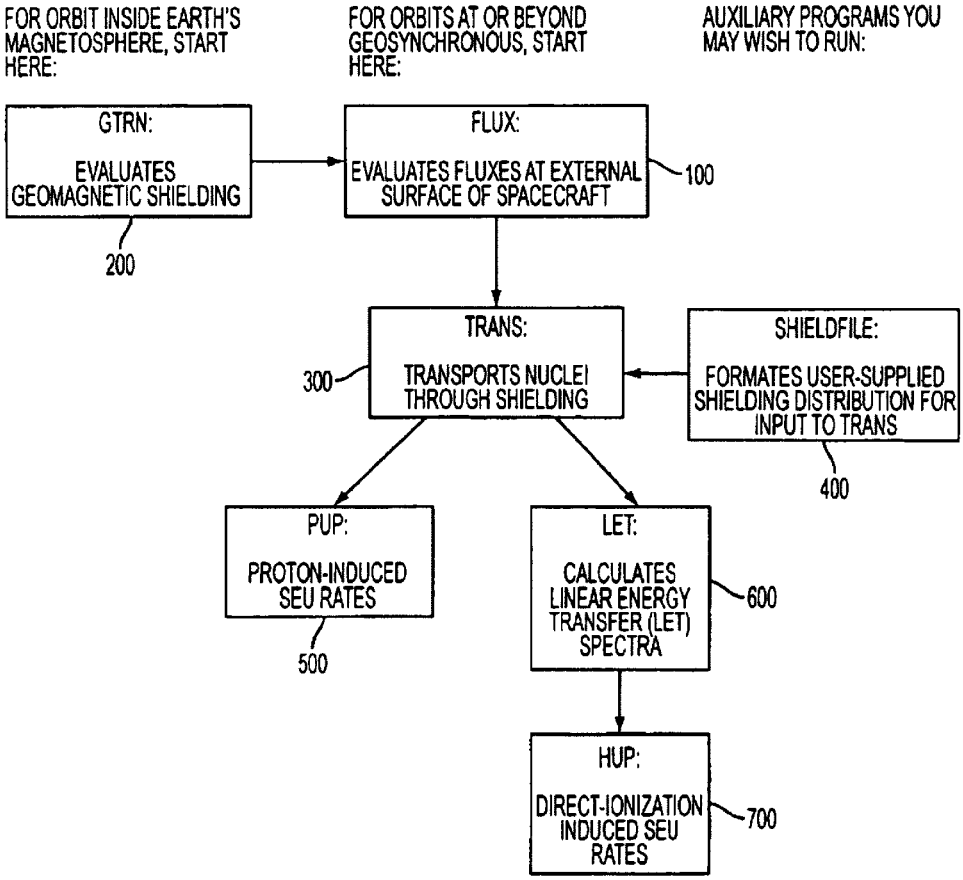
FIG. 1 is a partial flowchart for a preferred embodiment of the invention.

Referring to FIG. 1, one sees that CREME96 produces two type of outputs: proton-induced SEU rates, and direct ionization induced SEU rates. Each of these will represent an upset rate for a given electronic device in a satellite with a given shielding, under given environmental conditions, for a satellite in a given orbit or orbit segment.

Referring to 100, in the case where the specified satellite orbit is at or above a given altitude, nominally geosynchronous, the software will evaluate the fluxes of SEU-inducing particles at the outer surface of the satellite, from a number of sources including galactic cosmic rays (GCR), anomalous cosmic rays (ACR), and solar heavy ions. The environment at such satellite orbits is referred to herein as the "non-trapped energetic particle environment", since it is essentially equivalent to the environment at other locations that are at about 1 AU from the sun, but outside of the volume where trapped or quasi-trapped particles would be found in significant numbers.

Referring to 200, in the case where the specified satellite orbit is below a given altitude, nominally geosynchronous, before the flux at the outer surface of the satellite is evaluated, the shielding effect of the earth's magnetosphere is evaluated. As persons of ordinary skill in the art will recognize, the earth's magnetic field will shield out a significant fraction of charged particles. Thus, it is necessary to first subtract from the flux in the non-trapped energetic particle environment that fraction of the flux that will be shielded by the magnetosphere.

Referring to 300, the external hull of a satellite (typically made from thin aluminum panels) will sheild the electronics of the satellite from a fraction of SEU-inducing particles. Thus, determining an SEU rate for microelectronics on a given satellite will require taking this shielding into account by correcting the flux for the energy lost in said shielding and for the fragmentation of the incident particles within said shielding, and subtracting from the flux of SEU-inducing particles the subset of SEU-inducing particles with energies that are not sufficient to penetrate through the hull of the satellite. This module of the software performs that function. Although, as indicated by the dashed lines in the flowchart, this module may be bypassed, it is highly preferred to not bypass this module.

Referring to 400, although an approximation of the satellite hull shielding may be obtained by assuming that the shielding is uniformly distributed about the electronics of interest, more realistic results may be obtained by specifying the particular distribution of shielding about the electronics for a particular satellite. This module of the software performs that function.

Referring to 500, after the software measures the transmission of SEU-inducing particles, the software will measure the effect of SEU-inducing protons on the electronics of interest.

Referring to 600, after the software measures the transmission of SEU-inducing particles, the software will calculate the linear energy transfer to the electronics of interest. This module of the software takes an input file in the form of a particle flux vs. kinetic energy table for each elemental species, and generates an output file in the form of a function specifying the combined flux of all these species as a function of the rate of energy deposition. This is an intermediate result for the calculation of SEU rates attributable to direct ionization.

Referring to 700, this program module takes the output linear energy transfer spectrum from 600, combines this with parameters for the particular electronic device, calculates a SEU rate for the device attributable to direct ionization. The parameters are typically based on ground tests of the sensitivity to a particular chip to SEU-inducing radiation.

Having given an overview of this preferred embodiment of the invention, a more detailed description of the particular software modules making up this preferred embodiment is given.

Geomagnetic Transmission Function

Although it has been known that the magnetosphere shields cosmic rays, quantifying this effect to a degree of accuracy that could lead to accurate models of the effects of cosmic rays on electronics within the magnetosphere has proven elusive. One difficulty has been the lack of accurate models for the magnetosphere. Another difficulty has been that even if an accurate model of the magnetosphere were available, modeling the shielding effect of the magnetosphere requires an inordinate amount of computer processing time.

Figure 2:
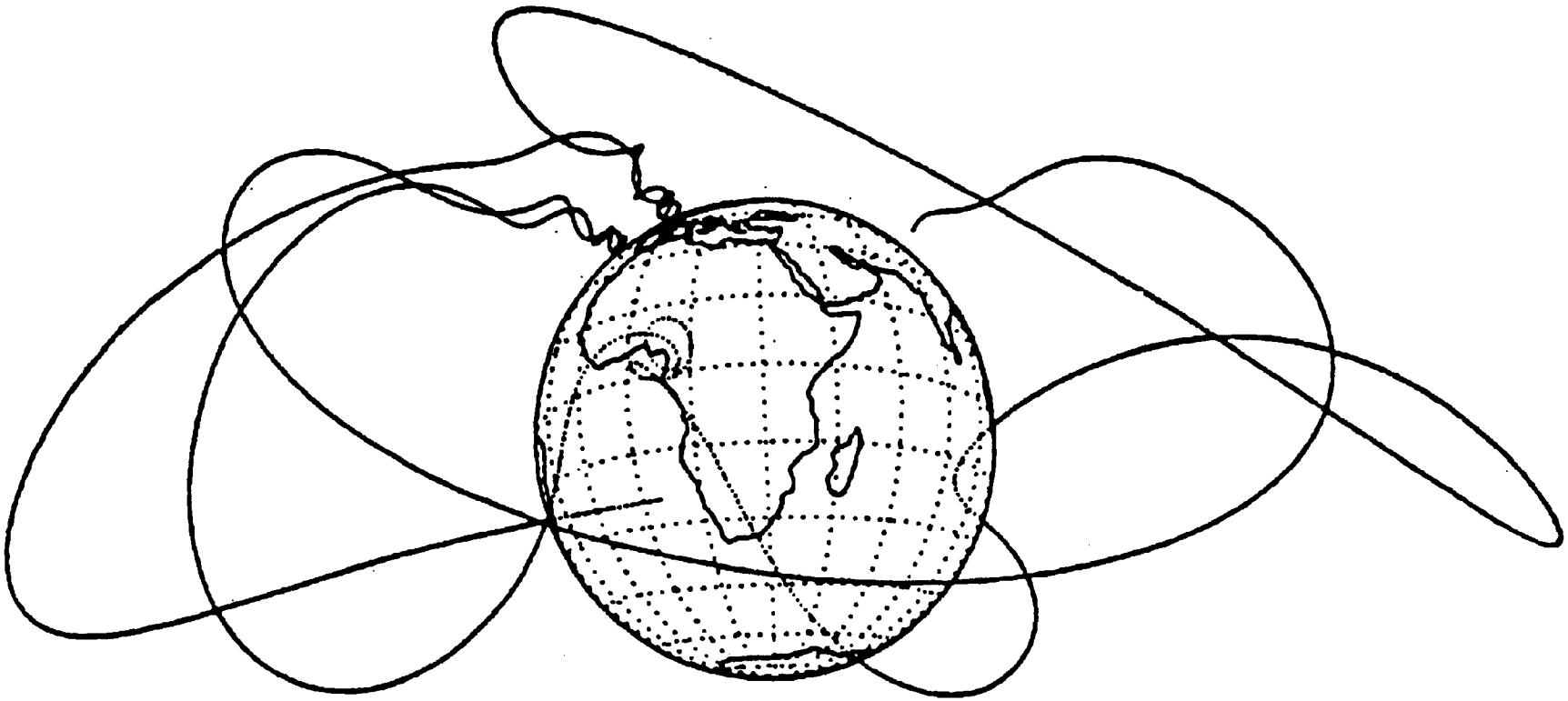
FIG. 2 PRIOR ART
FIG. 2 is an elevation of the earth, showing the path of a cosmic ray particle in the magnetosphere.

Referring to FIG. 2, this figure shows a representative path of a cosmic ray through the earth's magnetosphere (not shown). This path is highly irregular, including numerous changes of direction, and covering widely-spaced areas over earth's surface. Determining whether a particle with such a convoluted path will intersect a body as small as a typical satellite is a considerable challenge.

$B_{IGRF}$ is the International Geomagnetic Reference Field promulgated by the International Association of Geomagnetism and Aeronomy. It is the internationally accepted standard expression for the earth's internal magnetic field. It has been discovered that the $B_{IGRF}$ is insufficient, and that the most well-known model of the magnetospheric B fields, the model provided by Tsyganenko et al., "A Magnetospheric Magnetic Field Model with a Warped Tail Current Sheet", *Planet. Space Sci.,* 37(1) 5-20 (1989), is likewise insufficient. Corrections to this model are included in the present invention.

It has been discovered that within the earth's magnetosphere, the total magnetic field can be modeled by;

$$B=B_{IGRF}(r,t')+B_{TSYG}(Kp,r,t')$$

where $B_{IGRF}$ is the International Geomagnetic Reference Field promulgated by the International Association of Geomagnetism and Aeronomy, and $B_{TSYG}$ is the modified Tsyganenko field given by the sum of $B_{Xmg}^{(T)}+B_{Ymg}^{(T)}+B_{Zmg}^{(T)}+B_{Xmg}^{(RC)}+B_{Ymg}^{(RC)}+B_{Zmg}^{(RC)}+B_{Xsm}^{(C)}+B_{Ysm}^{(C)}+B_{Zsm}^{(C)}+B_{Xsm}^{(M)}+B_{Ysm}^{(M)}+B_{Zsm}^{(M)}$, where coordinates in the solar magnetospheric system are denoted sm, and where coordinates in the solar magnetic coordinate system are denoted mg; and where $$B_{Xsm}^{(T)}=Q_T x_{sm} z_r;$$

$$B_{Ysm}^{(T)}=Q_T y_{sm} z_r;$$

$$B_{Zsm}(T)=\frac{W(x,y)}{S_T}\left(C_1+C_2\frac{a_T+\xi_T}{S_T^2}\right)+\frac{x\frac{\partial W}{\partial x}+y\frac{\partial W}{\partial y}}{S_T+a_T+\xi_T}\times\left(C_1+\frac{C_2}{S_T}\right)+$$

-continued $$B_x(T)\frac{\partial z_s}{\partial x}+B_Y(T)\frac{\partial z_s}{\partial y}-Q_T D_T\left(x\frac{\partial D_T}{\partial x}+y\frac{\partial D_T}{\partial y}\right)$$

where $$W(x,y)=0.5\left(1-\frac{x-x_0}{[(x-x_0)^2+D_x^2]^{\frac{1}{2}}}\right)$$

where $$Q_T=\frac{W(x,y)}{\xi_T S_T}\left[\frac{C_1}{S_T+a_T+x_T}+\frac{C_2}{S_T^2}\right];$$

where $z_r=z-z_s(x,y,\psi)$, $$z_s(x,y,\psi)=0.5\tan\psi\left(x+R_c-\sqrt{(x+R_c)^2+16}\right)-G\sin\psi\cdot y^4(y^4+L_y^4)^{-1},$$

where $$S_{T,RC}=\sqrt{\rho^2+(a_{T,RC}+\xi_{T,RC})^2},$$

$$\xi_{T,RC}=\sqrt{z_r^2+D_{T,RC}^2},$$

$$D_T=D_0+\delta y^2+\gamma_T h_T(x)+\gamma_1 h_1(x),$$

where $C_1=-98.72$ when Kp=0, $0^-$, $C_1=-35.64$ when Kp=$1^-$,1,$1^+$, $C_1=-77.45$ when Kp=$2^-$,2,$2^+$, $C_1=-70.12$ when Kp=$3^-$,3,$3^+$, 0, $0^+$, $C_1=-162.5$ when Kp=$4^-$,4,$4^+$, $C_1=-128.4$ when Kp≧$5^-$, where $C_2=-10014$ when Kp=0, $0^-$, $C_2=-12800$ when Kp=$1^-$,1,$1^+$, $C_2=-14588$ when Kp=$2^-$,2,$2^+$, $C_2=-16125$ when Kp=$3^-$,3,$3^+$, 0, $0^+$, $C_2=-15806$ when Kp=$4^-$,4,$4^+$, $C_2=-16184$ and when Kp≧$5^-$, where $a_T=13.55$ when Kp=0, $0^-$, $a_T=13.81$ when Kp=$1^-$, 1,$1^+$, $a_T=15.08$ when Kp=$2^-$,2,$2^+$, $a_T=15.63$ when Kp=$3^-$,3,$3^+$, 0, $0^+$, $a_T=16.11$ when Kp=$4^-$,4,$4^+$, $a_T=15.85$ when Kp≧$5^-$, where $D_0=2.08$ when Kp=0, $0^+$, $D_0=1.664$ when Kp=$1^-$, 1,$1^+$, $D_0=1.541$ when Kp=$2^-$,2,$2^+$, $D_0=0.9351$ when Kp=$3^-$,3,$3^+$, 0, $0^+$, $D_0=0.7677$ when Kp=$4^-$,4,$4^+$, $D_0=0.3325$ when Kp≧$5^-$, where $R_c=8\ R_E$ and $L_y=10\ R_E$, $$B_X^{(RC)}=Q_{RC}xz_r;$$

$$B_Y^{(RC)}=Q_{RC}yz_r;$$

$$B_Z^{(RC)}=C_5\frac{2(a_{RC}+\xi_{RC})^2-\rho^2}{S_{RC}^5}+B_X^{RC}\frac{\partial z_s}{\partial x}+B_Y^{RC}\frac{\partial z_s}{\partial y}-Q_{RC}D_{RC}x\frac{\partial D_{RC}}{\partial x};$$

where $Q_{RC}=3C_5\xi_{RC}^{-1}S_{RC}^{-5}(a_{RC}+\xi_{RC})$ $D_{RC}=D_0+\gamma_{RC}h_{RC}(x)+\gamma_1 h_1(x)$ $h_{T,RC}=0.5[1+x(x^2+)$ $h_{T,RC}=0.5[1+x(x^2+L^2{}_{T,RC})^{-1/2}]$, $h_1=0.5\{1-(x+16)[(x+16)^2+36]^{-1/2}\}$, $C_5(DST)=-10220+408.5\cdot DST$ $$B_{XYZ}^{(C)}=C_3(F^+{}_{x,y,z}+F^-{}_{x,y,z})+C_4(F^+{}_{x,y,z}-F^-{}_{x,y,z}),$$

where $$\left\{\frac{F_x^{\pm}}{F_y^{\pm}}\right\}=\pm\frac{W_c(x,y)}{S^{\pm}[S^{\pm}\pm(z\pm R_T)]}\times\left\{\frac{x}{y}\right\},$$

-continued $$F_z^{\pm} = \frac{W_c(x, y)}{S^{\pm}} + \left(x\frac{\partial W_c}{\partial x} + y\frac{\partial W_c}{\partial y}\right) \times \frac{1}{S^{\pm} \pm (z \pm R_T)},$$

$$S^{\pm} = [(z \pm R_T)^2 + x^2 + y^2]^{\frac{1}{2}},$$

$$W_c(x, y) = 0.5\left[1 - \frac{x - x_{0c}}{[(x - x_{0c})^2 + L_{xc}^2]^{\frac{1}{2}}}\right] \times (1 + y^2 / D_{yc}^2)^{-1};$$

$$B_X^{(M)} = e^{x/\Delta x}[C_6 z \cos\psi + (C_7 + C_8 y^2 + C_9 z^2) \sin\psi],$$

$$B_Y^{(M)} = e^{x/\Delta x}[C_{10} yz \cos\psi + (C_{11} y + C_{12} y^3 + C_{13} yz^2) \sin\psi],$$

and $$B_Z^{(M)} = e^{x/\Delta x}[(C_{14} + C_{15} y^2 + C_{16} z^2) \cos\psi + (C_{17} z + C_{18} zy^2 + C_{19} z^3) \sin\psi],$$

where $C_6$ through $C_{19}$ are given by:

| | Kp | | | | | |
|---|---|---|---|---|---|---|
| $C_n$ | = 0, $0^+$ | = $1^-$, 1, $1^+$ | = $2^-$, 2, $2^+$ | = $3^-$, 3, $3^+$ | = $4^-$, 4, $4^+$ | ≧$5^-$ |
| $C_6$ | 1.813 | 2.316 | 2.641 | 3.181 | 3.607 | 4.090 |
| $C_7$ | 31.10 | 35.64 | 42.46 | 47.50 | 51.10 | 49.09 |
| $C_8$ | −0.07464 | −0.0741 | −0.07611 | −0.1327 | −0.1006 | −0.0231 |
| $C_9$ | −.07764 | −0.1081 | −0.1579 | −0.1864 | −0.1927 | −0.1359 |
| $C_{10}$ | 0.003303 | 0.003924 | 0.004078 | 0.01382 | 0.03353 | 0.01989 |
| $C_{11}$ | −1.129 | −1.451 | −1.391 | −1.488 | −1.392 | −2.298 |
| $C_{12}$ | 0.001663 | 0.00202 | 0.00153 | 0.002962 | 0.001594 | 0.004911 |
| $C_{13}$ | 0.000988 | 0.00111 | 0.000727 | 0.000897 | 0.002439 | 0.003421 |
| $C_{14}$ | 18.21 | 21.37 | 21.86 | 22.74 | 22.41 | 21.79 |
| $C_{15}$ | −0.03018 | −0.04567 | −0.04199 | −0.04095 | −0.04925 | −0.05447 |
| $C_{16}$ | −0.03829 | −0.05382 | −0.06523 | −0.09223 | −0.1153 | −0.1149 |
| $C_{17}$ | −0.1283 | −0.1457 | −0.6412 | −1.059 | −1.399 | −0.2214 |
| $C_{18}$ | −0.001973 | −0.002742 | −0.000948 | −0.001766 | 0.000716 | −0.01355 |
| $C_{19}$ | 0.000717 | 0.001244 | 0.0002276 | 0.003034 | 0.002696 | 0.001185 |

and where $L_y$=10.0, $D_x$=13.0, $L_{RC}$=5.0, $L_T$=6.30, $\gamma_T$=4.0, $\delta$=0.010, $\gamma_1$=1.0, $R_T$=30.0, $x_{0c}$=4.0, $L_{xc}$=50.0, and $D_{yc}$=20.0.

Additional parameters relevant to the present invention given in the Tsyganenko reference include (from page 12 of Tsyganenko, supra):

| | Kp | | | | | |
|---|---|---|---|---|---|---|
| parameter | = 0, $0^+$ | = $1^-$, 1, $1^+$ | = $2^-$, 2, $2^+$ | = $3^-$, 3, $3^+$ | = $4^-$, 4, $4^+$ | ≧$5^-$ |
| N | 3975 | 9977 | 9848 | 7309 | 3723 | 1850 |
| <Bc> | 15.49 | 19.06 | 21.71 | 25.48 | 28.58 | 32.88 |
| $C_1$ | 6.51 | 8.52 | 9.75 | 11.35 | 12.41 | 15.12 |
| $C_2$ | −98.72 | −35.64 | −77.45 | −70.12 | −162.50 | −128.40 |
| $C_3$ | −10014 | −12800 | −14588 | −16125 | −15806 | −16184 |
| $C_4$ | 15.03 | 14.37 | 64.85 | 90.71 | 160.60 | 149.10 |
| $C_5$ | 76.62 | 124.50 | 123.90 | 38.08 | 5.888 | 215.50 |
| $\Delta x$ | 24.74 | 22.33 | 20.90 | 18.64 | 18.31 | 19.48 |
| $a_{RC}$ | 8.161 | 8.119 | 6.283 | 6.266 | 6.196 | 5.831 |
| $D_0$ | 2.08 | 1.664 | 1.541 | 0.9351 | 0.7677 | 0.3325 |
| $\gamma_{RC}$ | −0.8799 | 0.9324 | 4.183 | 5.389 | 5.072 | 6.472 |
| $R_c$ | 9.084 | 9.238 | 9.609 | 8.573 | 10.06 | 10.47 |
| G | 3.838 | 2.426 | 6.591 | 5.935 | 6.668 | 9.081 |
| $a_r$ | 13.55 | 13.81 | 15.08 | 15.63 | 16.11 | 15.85 |
| $D_y$ | 26.94 | 28.83 | 30.57 | 31.47 | 30.04 | 25.27 |
| $X_0$ | 5.745 | 6.052 | 7.435 | 8.103 | 8.260 | 7.976 |

It should be noted that the model for $B_{TSYG}$ differs from the model given in Tsyganenko, supra. In the first place, the author has identified several errata to this model. In the second place, the present inventors have modified the model, making $C_5$ a linear function of Dst for all geomagnetic activity levels. See Boberg et al.

Figure 3A:
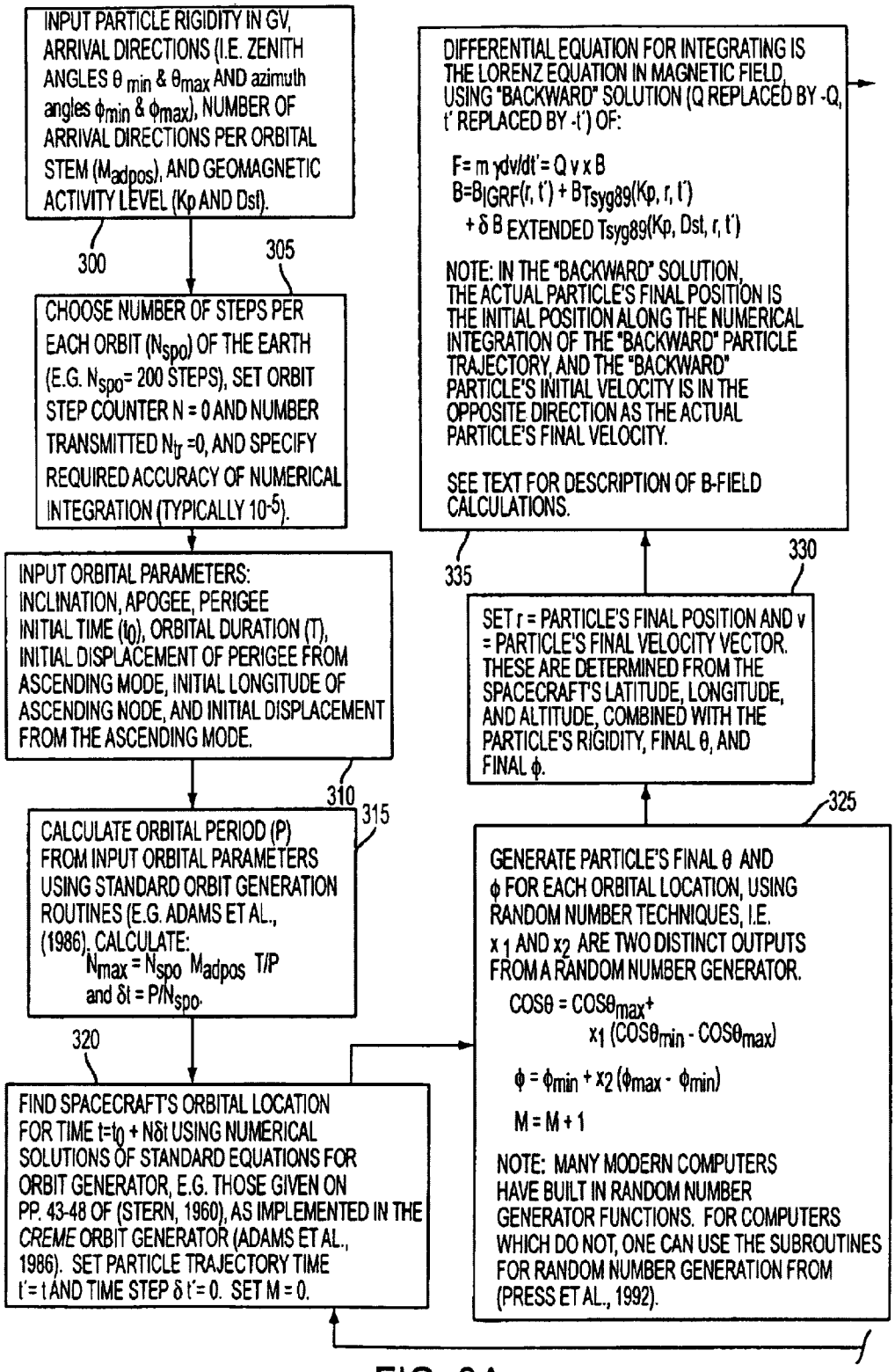
FIG. 3 is a flowchart for a method for calculating a geomagnetic transmission function for cosmic rays according to the invention.
Figure 3B:
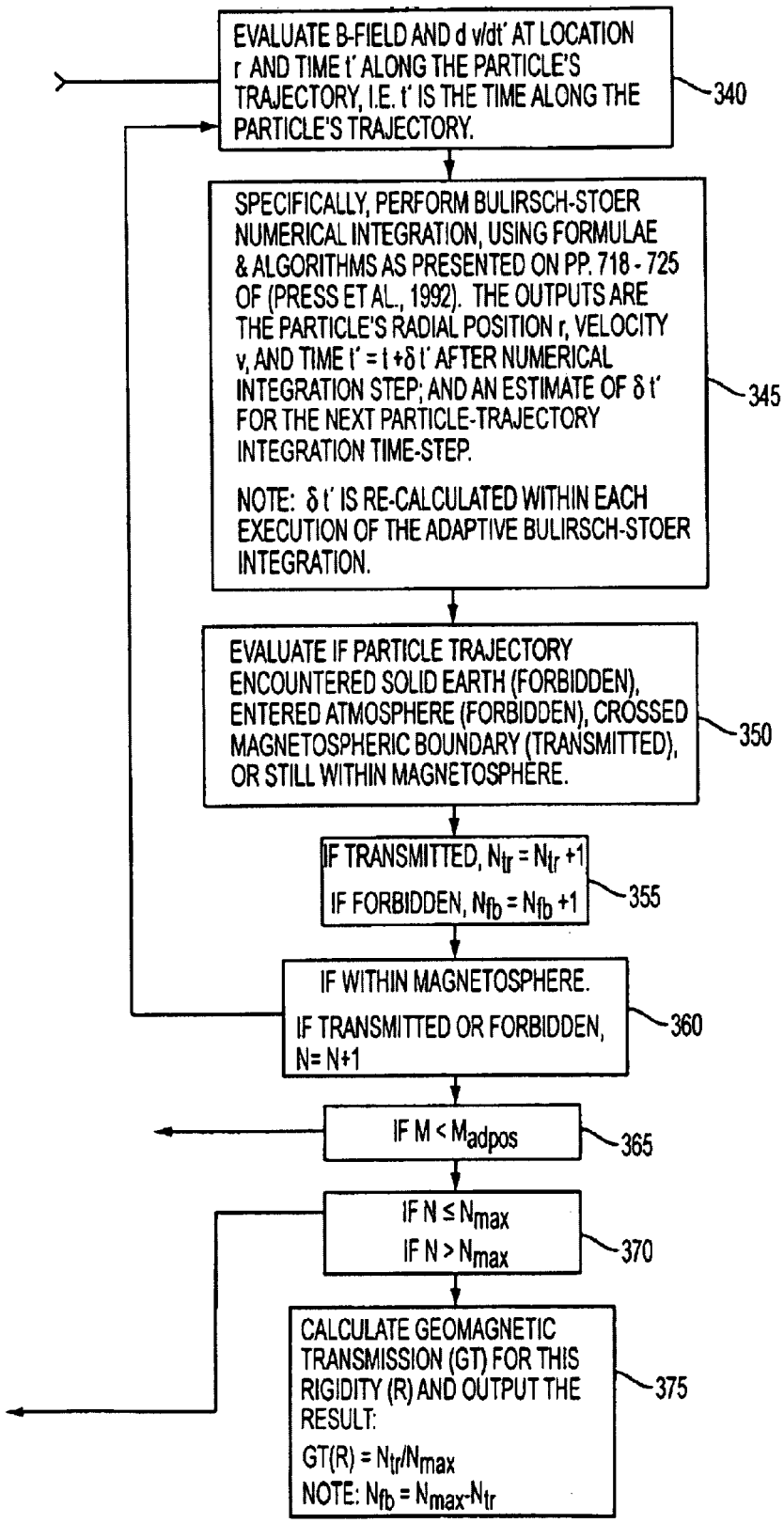
Figure 4:
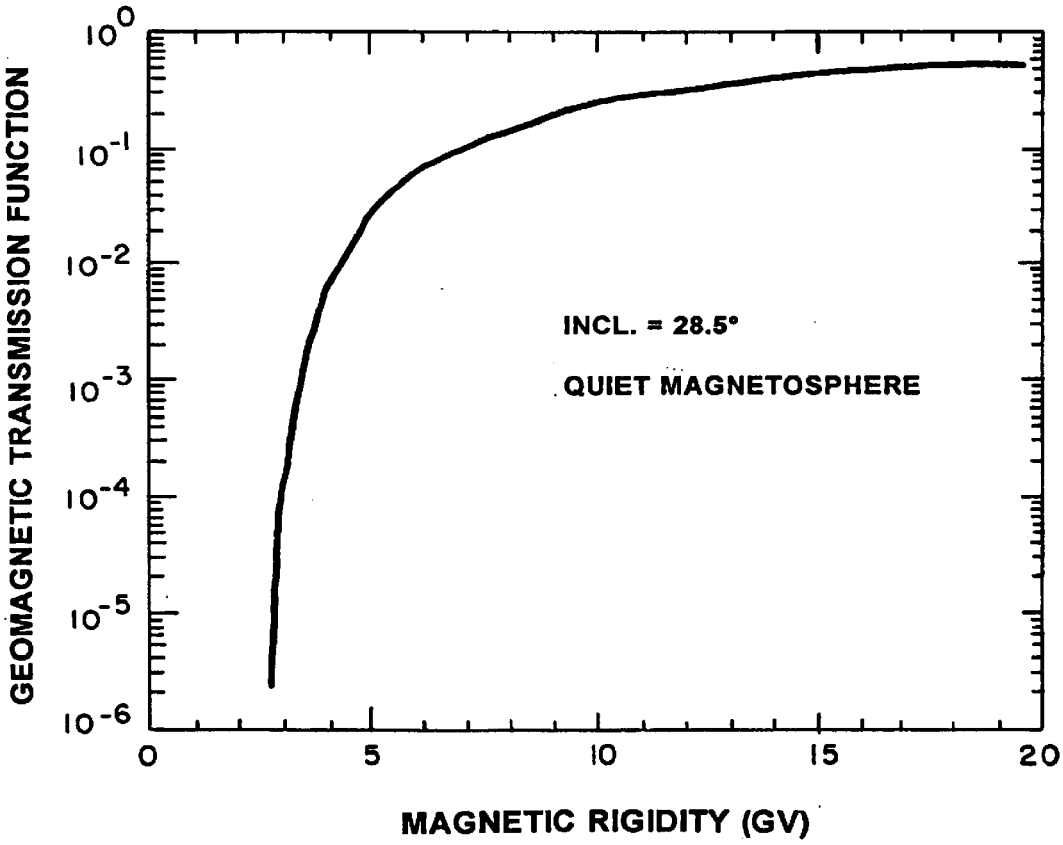
FIG. 4 PRIOR ART
FIG. 4 is a plot of a geomagnetic transmission function for a low inclination space shuttle orbit under quiet magnetospheric conditions.
Figure 5:
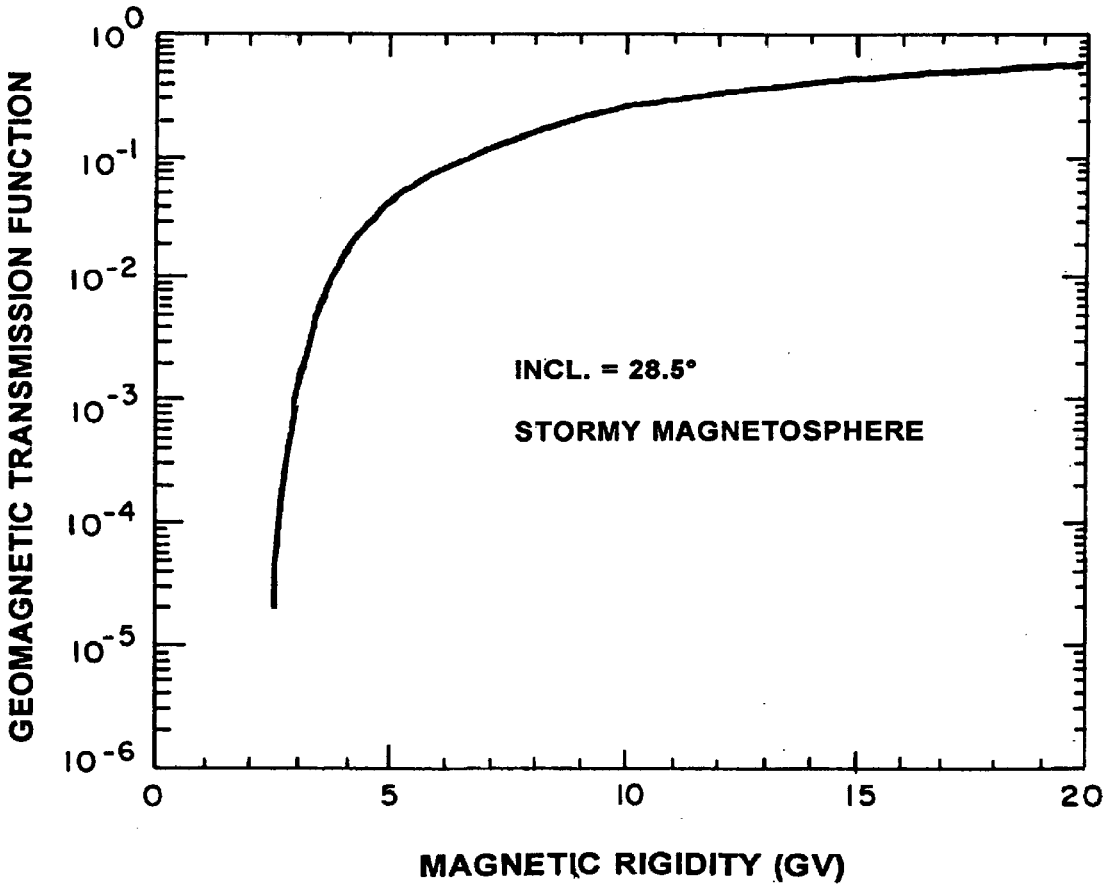
FIG. 5 PRIOR ART
FIG. 5 is a plot of a geomagnetic transmission function for a lo inclination space shuttle orbit under stormy magnetospheric conditions.
Figure 6:
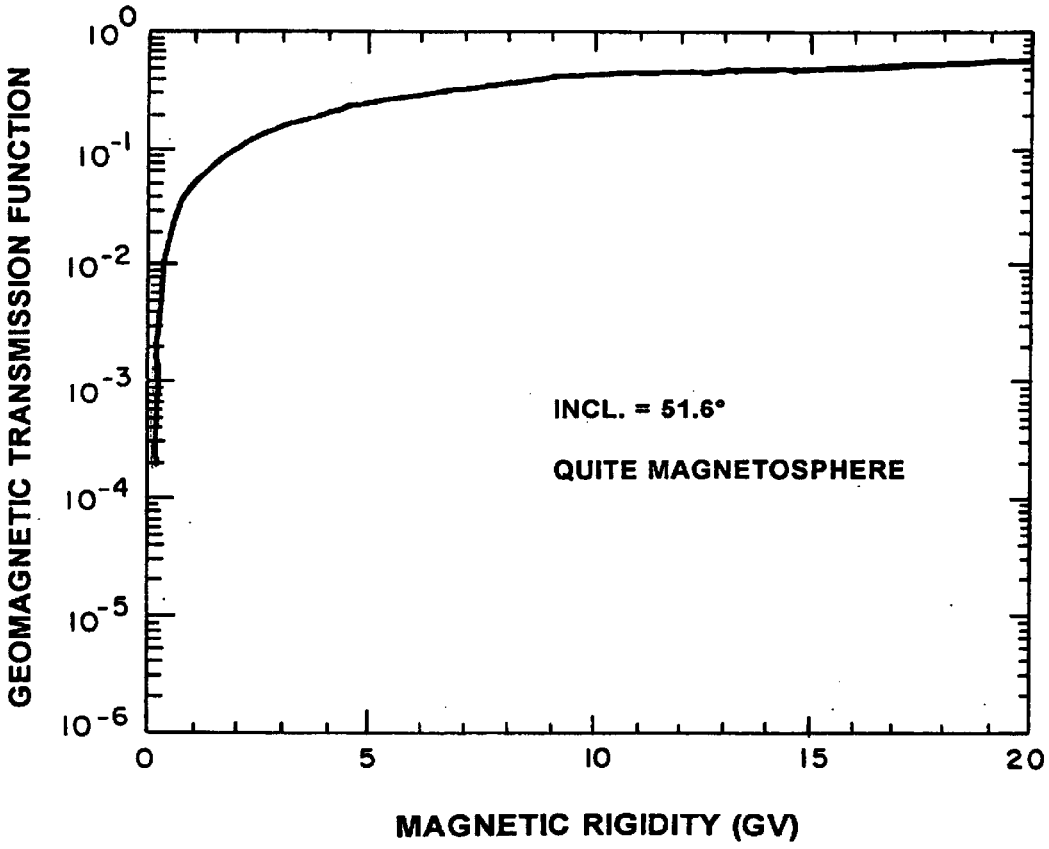
FIG. 6 PRIOR ART
FIG. 6 is a plot of a geomagnetic transmission function for a space station orbit under quiet magnetospheric conditions.
Figure 7:
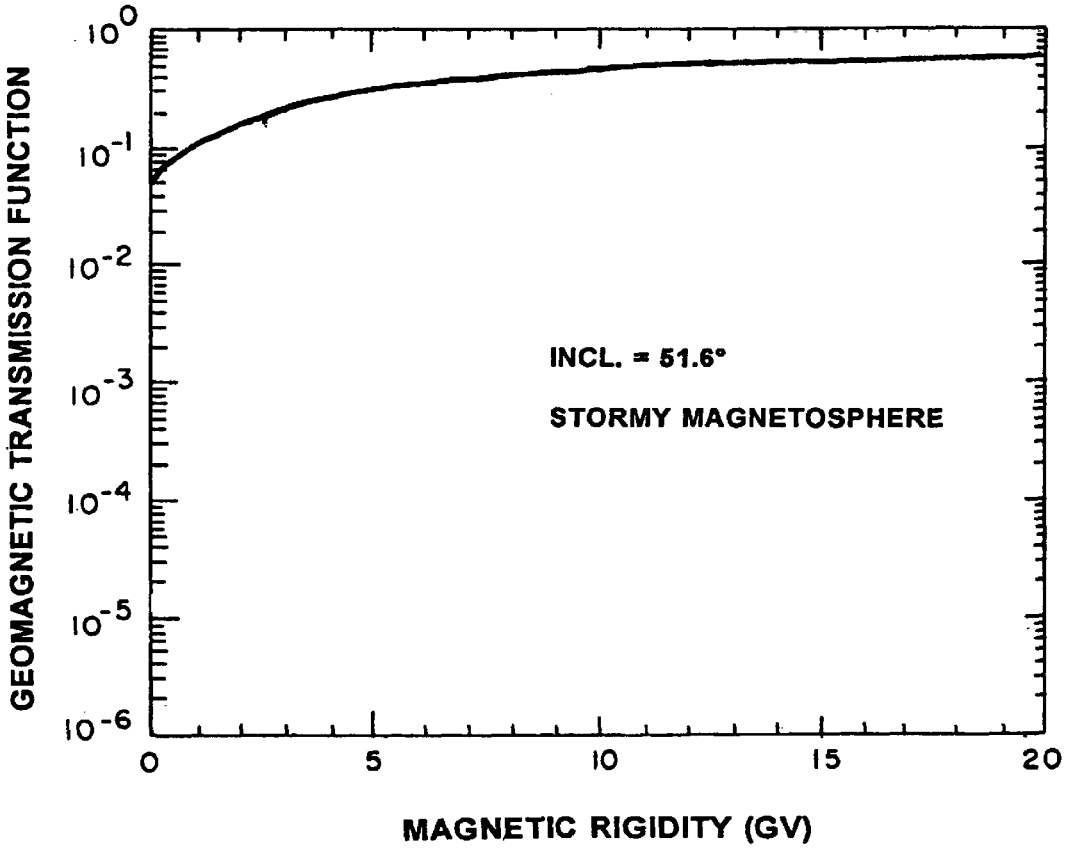
FIG. 7 PRIOR ART
FIG. 7 is a plot of a geomagnetic transmission function for a space station orbit under stormy magnetospheric conditions.

Referring to FIG. 3, the Lorentz equation using a corrected model for the geomagnetic B field is used to calculate the geomagnetic transmission function, using the method depicted in this flowchart. Given the large computational requirements for this calculation, it is preferred to make this calculation in advance for as many orbits as desired, and storing the results as a series of geomagnetic transmission function tables, with the geomagnetic transmission probability given for each particle rigidity (rigidity≡momentum/charge), where each table corresponds to the geomagnetic transmission function for a particular orbit. The user may then select from several predefined orbits having predefined geomagnetic transmission functions. Alternatively, especially as computer processing power increases, in another embodiment of the invention, this calculation of the geomagnetic transmission function may be performed after a user has specified an orbit.

Referring to 300, the calculation of the geomagnetic transmission function will typically begin by specifying a particle rigidity in GV, a range of particle arrival directions by specifying a range of azimuth angles between $\theta_{max}$ and $\theta_{min}$ and a range of zenith angles between $\phi_{max}$ and $\phi_{min}$, specifying an earth orbit, and specifying a geomagnetic activity level by specifying values for Kp and Dst, where Kp=[IATME or IAGA] planetary Kp index and Dst=the hourly equatorial Dst index. A standard reference for the definition of Kp is Bartels, J., "The standard index, Ks, and the planetary index, Kp", IATME Bulletin 12b, 97 IUGG Pub. Office, Paris, 1949. IATME is the International Association of Terrestrial Magnetism and Electricity. IAGA is the International Association of Geomagnetism and Aeronomy. IUGG is the International Union of Geodesy and Geophysics. A standard reference for the definition of Dst is Sugiura, M., "Hourly values of equatorial Dst for the IGY", Ann. Int. Geophys. Year, 35, 49, 1964. The Dst index was adopted by IAGA at the 1969 meeting in Madrid. IAGA Bulletin 27, 1969, 123, resolution 2. All of the references cited in this paragraph are incorporated herein by reference, in their entireties, for all purposes.

For each value of particle rigidity, the transmission probability will be calculated, and each of these results will be compiled into a table giving the geomagnetic transmission function for a given orbit. A separate geomagnetic transmission function table will be prepared for each specified geomagnetic activity level. The user will also specify an arbitrary number of arrival directions per orbital step $M_{adpos}$.

Referring to 305, the user will specify an arbitrary number of orbital steps $N_{spo}$, where $N_{spo}$ is the number of steps in one orbital revolution of the satellite around the Earth's spin axis. The user will also specify a required accuracy for the numerical integration. This embodiment of the invention relies on tracing the particle trajectories backwards from a discrete number of evenly spaced satellite orbital positions. Persons of ordinary skill in the art will recognize, however, that alternative embodiments might be employed, such as embodiments using a Monte Carlo simulation, to trace particle trajectories backwards from randomly selected satellite orbital positions.

Referring to 310, the user will specify the satellite orbit.

Referring to 315, the software will calculate the orbital period from the orbit parameters, using standard orbit generation routines. See Adams et al., NRL Memorandum Report 5099, supra. The software will also calculate a maximum number of steps, and a time per step for the satellite to travel through a step.

Referring to 320, the software will calculate the position of the satellite after each step. See Adams et al., NRL Memorandum Report 5099, supra. The software will also begin tracing the position of a particle incident on the satellite by initializing the particle trajectory time.

Referring to 325, for each of the specified number of arrival directions per orbital step, the software will select a random particle arrival direction. Persons of ordinary skill in the art will recognize, however, that alternative embodiments might be employed, such as embodiments where a number of regularly spaced arrival directions are used.

Referring to 330, the software will calculate the particle's final position and velocity vector v from the satellite's latitude, longitude, altitude, and the particle's rigidity, final $\theta$, and final $\phi$.

Referring to 330, 340, 345, the software will calculate a new particle position by performing a numerical integration of the Lorentz equation. Although this preferred embodiment uses the Bulirsch-Stoer numerical integration technique, persons of ordinary skill in the art will recognize that other numerical integration techniques are available. This numerical integration is performed on a modified Lorentz equation, where Q is replaced by −Q and t' is replaced by −t'. As persons of ordinary skill in the art will note, the Lorentz equation is invariant if one makes this substitution. This significantly simplifies the numerical integration, because the solution in this case will represent tracing a particle backwards in time from the satellite to the boundary of the magnetosphere (for allowed trajectories) or earth's surface or atmosphere (for forbidden trajectories). This will typically entail far fewer calculations than if particles incident on the magnetosphere where traced forward in time to see if they intersected the satellite. However, persons of ordinary skill in the art will recognize that this tracing forward in time is an equally valid method.

Referring to 350, 355, 360, the software will determine whether, after this iteration of the numerical integration, the particle's new position has placed it within the atmosphere or the solid earth (representing a forbidden trajectory), beyond the magnetosphere as given by the model (representing an allowed trajectory), or still within the magnetosphere (representing an undetermined trajectory). If the particle is still within the magnetosphere, another iteration of the numerical integration is performed, and a new particle position determined. If the particle is not still in the magnetosphere, i.e., particle has reached either earth's surface or atmosphere (forbidden) or the outside of the magnetosphere (allowed), the software will store this result. This preferred embodiment of the software has an error trapping technique, where if the number of particle steps becomes very large, the particle is forced to an allowed or forbidden transition.

Referring to 365, if the software has reached a solution for a given particle arrival direction at a given orbital step, the software will move on to trace the particle arriving at the next arrival direction for that orbital step, if any.

Referring to 370, if the software has reached solutions for all the arrival directions for the satellite at a given orbital step, the software moves the satellite along to the next orbital step, if any.

Referring to 375, after all particle tracings for all orbital steps have been performed, the results are compiled as a geomagnetic transmission function of the form $GT(R)=N_{tr}/N_{max}$, where GT is the probability of a particle being transmitted through the magnetosphere, R is particle rigidity, and $N_{tr}$ and $N_{max}$ are a number of particles transmitted and a total number of particles, respectively. Typically, this function will be embodied in a lookup table.

Calculating a geomagnetic transmission function for a given orbit according to the above method is an intensive process. Computing geomagnetic transmission functions for two particular orbits (the proposed space station orbit and a typical space shuttle orbit) required several days of processor time on a RISC workstation. Shorter computation cycles could be made on a supercomputer, but supercomputer time is in chronic short supply. Accordingly, it is preferred to calculate geomagnetic transmission functions for preselected orbits in advance, and to store these geomagnetic transmission functions for later use by users. This is the approach taken by the inventors in their CREME96 software. In cases where a user specifies an orbit that is not among the precalculated orbits, the CREME96 software will use an earlier model that uses geomagnetic cutoff tables (see NRL Memorandum Report 5099, supra) rather that geomagnetic transmission functions, and warns the user of this substitution.

Alternatively, a user would specify an orbit, and if the software did not have a precalculated geomagnetic transmission function for this orbit, the software would calculate this geomagnetic transmission function. This embodiment is anticipated to become increasingly desirable as processing capacity increases.

Referring to FIGS. 4, 5, 6, and 7, these plots show the geomagnetic transmission function for a common space shuttle orbit (circular orbit, 450 km altitude, 28.5° inclination) under "quiet" (FIG. 4) and "stormy" (FIG. 5) conditions, and the geomagnetic transmission function for the proposed space station orbit (circular orbit, 450 km altitude, 51.6° inclination) under "quiet" (FIG. 6) and "stormy" (FIG. 7) conditions. "Quiet" magnetospheric conditions were taken herein to be KP=2 and Dst=−15 nT, while "stormy" magnetospheric conditions were taken herein to be KP≧5 and Dst=−300 nT. One sees that (1) transmission drops off sharply with decreasing rigidity, and (2) the differences between stormy and quiet conditions are seen most at lower rigidities.

The embodiment of the invention implemented in the CREME96 software operates by prompting a user to specify an orbit and magnetospheric conditions, and then looking up the appropriate geomagnetic transmission function table for the orbit and magnetospheric conditions. The CREME96 software includes lookup tables corresponding to each of FIGS. 4 through 7. This table is then applied to a flux of SEU-inducing particles in the non-trapped energetic particle environment (calculated by another part of the CREME96 software), to determined the flux of such SEU-inducing particles at the outer surface of the satellite. In other words, the flux from the non-trapped energetic particle environment will be multiplied by the probability (as embodied in the geomagnetic transmission function) that the particles will be transmitted through the magnetosphere, to get the flux at the outer surface of the satellite.

Particle Flux Modeling

Four principal classes of particles are considered to be responsible for most SEUs: galactic cosmic rays (GCRs), anomalous cosmic rays (ACRs), solar protons, and solar heavy ions. See NRL Memorandum Report 4056, supra.

To estimate the effect of these classes of particles on orbiting microelectronics, it is first necessary to estimate the exposure of the microelectronics to these particles. Thus, a feature of any complete model for the effect of cosmic rays on microelectronics will be the modeling of the flux of each of these types of particles.

In the present invention, particle fluxes are determined at the near earth environment. As used herein, the near earth environment refers to the environment found at locations approximately 1 AU from the sun, but outside of earth's magnetosphere or other localized phenomena that would perturb particle fluxes. After the particle fluxes for each type of particle is determined by the FLUX module of a preferred embodiment of the present invention, other modules may be used to model how the charged particles will induce single event upsets, including what shielding effects (including shielding by the magnetosphere and shielding by the hull of the spacecraft) will reduce this flux at the component level.

In a preferred embodiment of the invention, the flux of the GCRs is modeled by the galactic cosmic ray model described by Nymmik et al. See "A Model of Galactic Cosmic Ray Fluxes", Nucl. Tracks Radiat. Meas. 20 427, Nymmik et al. (1992), incorporated herein by reference, in its entirety, for all purposes.

In a preferred embodiment of the invention, the flux of ACRs and solar protons are modeled by the model described in Tylka et al, supra.

In a preferred embodiment of the invention, the flux of solar heavy ions is modeled as depicted in FIGS. 8 and 9. This routine depicts how a solar heavy ion flux for a given atomic species at a given kinetic energy, under conditions that are selected from one of three available models: worst day, worst week, and peak flux. As used herein, the worst week solar heavy ion model refers to the model based on particle fluences averaged over a 180 hour span of the solar event beginning at 1300 UT on Oct. 19, 1989. As used herein the worst day solar heavy ion model refers to the model based on particle fluences averaged over an 18 hour span (beginning at 1300 UT on Oct. 20, 1989). As used herein, the peak flux solar heavy ion model refers to the model based on the highest fluxes averaged over 5 minute intervals reported by the Geostationary-orbiting Operational Environmental Satellite (GOES) satellite.

Referring to 800, this routine takes as inputs the atomic number of the selected species, and the kinetic energy for that species whose flux is to be determined. The routine also takes as inputs the user selected baseline model (worst week, worst day, or peak flux).

Referring to 805, if the selected species has atomic number greater than 20, iron is selected as the model spectrum for the flux of this species 810. Otherise, 815, oxygen is selected as the model spectrum for the flux of this species.

Referring to 820, the next step is to look up an elemental breakpoint EB2. This breakpoint represents a value for the kinetic energy where the relationship between the flux and the kinetic energy changes to a degree where a different mathematical expression for this relationship is warranted. Values for EB2 are given in Table S1:

TABLE S1

Values for Elemental Breakpoint EB2, in MeV/nuc

| Elemental | Baseline model | |
|---|---|---|
| spectrum model | worst day or peak flux | worst week |
| iron | 24.23 | 19.90 |
| oxygen | 15.94 | 12.89 |

Optionally, this lookup may be performed later in the routine, after the IF step at 825.

Referring to 825, a special case exists for when the baseline model is the worst week model, the model element is Fe, and the kinetic energy being evaluated is above a certain cutoff point $E_{sp}$=127.93 MeV/nuc. In this case, referring now to FIG. 9, values for $A_{sp}$ and $G_{sp}$ are looked up from Table $S_2$ and Table S3, respectively, and the unscaled flux is calculated to be $A_{sp} \times En^{-Gsp}$, 900,910.

TABLE S2

Values for $A_{sp}$:

| Elemental | Baseline model | |
|---|---|---|
| spectrum model | worst day or peak flux | worst week |
| iron | not applicable | $3.16814 \times 10^6$ |
| oxygen | not applicable | not applicable |

TABLE S3

| Values for $G_{sp}$: | | |
|---|---|---|
| Elemental | Baseline model | |
| spectrum model | worst day or peak flux | worst week |
| iron | not applicable | 2.861 |
| oxygen | not applicable | not applicable |

Referring back to FIG. 8, if En>EB2 (835), values for $A_3$ and $\gamma_{si}$ are retrieved from tables $S_4$ and $S_5$, respectively (840), and the unscaled flux is calculated to be $A_3 \times En^{-\gamma_{si}}$ (845).

TABLE S4

| Values for $A_3$ | | |
|---|---|---|
| Elemental | Baseline model | |
| spectrum model | worst day or peak flux | worst week |
| iron | $0.252948 \times 10^{10}$ | $0.249719 \times 10^{9}$ |
| oxygen | $0.106702 \times 10^{10}$ | $0.667628 \times 10^{9}$ |

TABLE S5

| Values for $\gamma_{si}$ | | |
|---|---|---|
| Elemental | Baseline model | |
| spectrum model | worst day or peak flux | worst week |
| iron | 4.52970 | 3.7610 |
| oxygen | 4.14060 | 3.76850 |

Otherwise, for En≦EB2, values for $A_2$ and $G_{si}$ are retrieved from tables $S_6$ and $S_7$, respectively (855), and the unscaled flux is calculated to be $A_2 \exp(-G \times En^{1/4}) \times En^{1/4}$ (860).

TABLE S6

| Values for $A_2$ | | |
|---|---|---|
| Elemental | Baseline model | |
| spectrum model | worst day or peak flux | worst week |
| iron | $1.8991 \times 10^{8}$ | $3.0372 \times 10^{8}$ |
| oxygen | $4.9518\ w \times 10^{8}$ | $1.1307 \times 10^{9}$ |

TABLE S7

| Values for $G_{si}$ | | |
|---|---|---|
| Elemental | Baseline model | |
| spectrum model | worst day or peak flux | worst week |
| iron | 5.70 | 5.70 |
| oxygen | 5.70 | 5.70 |

For heavier species (IZ≧3), the flux must be scaled by looking up scale factors for the species being analyzed and the model element (if different from the species being analyzed). These scale factors are taken from Table S8:

TABLE S8

| Scale factors SF for atomic species with IZ ≧ 3 | |
|---|---|
| Atomic Number | Scale Factor |
| 5 | 0 |
| 6 | $4.704 \times 10^{-1}$ |
| 7 | $1.2059 \times 10^{-1}$ |
| 8 | 1 |
| 9 | $4.560976 \times 10^{-5}$ |
| 10 | $2.1312 \times 10^{-1}$ |
| 11 | $1.744715 \times 10^{-2}$ |
| 12 | $2.0624 \times 10^{-1}$ |
| 13 | $1.826829 \times 10^{-2}$ |
| 14 | $3.5935 \times 10^{-1}$ |
| 15 | $2.279675 \times 10^{-4}$ |
| 16 | $9.758 \times 10^{-2}$ |
| 17 | $1.680488 \times 10^{-4}$ |
| 18 | $1.771545 \times 10^{-3}$ |
| 19 | $3.644715 \times 10^{-4}$ |
| 20 | $4.826 \times 10^{-2}$ |
| 21 | $2.929 \times 10^{-4}$ |
| 22 | $4.377 \times 10^{-3}$ |
| 23 | 4.088 |
| 24 | $1.65 \times 10^{-2}$ |
| 25 | $5.625 \times 10^{-3}$ |
| 26 | 1 |
| 27 | $1.303 \times 10^{-2}$ |
| 28 | $3.172 \times 10^{-2}$ |
| 29 | $3.048 \times 10^{-4}$ |
| 30 | $7.457 \times 10^{-4}$ |
| 31 | $4.878 \times 10^{-5}$ |
| 32 | $1.22 \times 10^{-4}$ |
| 33 | $7.317 \times 10^{-6}$ |
| 34 | $7.317 \times 10^{-5}$ |
| 35 | $9.756 \times 10^{-6}$ |
| 36 | $4.878 \times 10^{-5}$ |
| 37 | $7.317 \times 10^{-6}$ |
| 38 | $2.439 \times 10^{-5}$ |
| 39 | $4.878 \times 10^{-6}$ |
| 40 | $1.22 \times 10^{-5}$ |
| 41 | $9.756 \times 10^{-7}$ |
| 42 | $4.878 \times 10^{-6}$ |
| 43 | 0 |
| 44 | $2.195 \times 10^{-6}$ |
| 45 | $4.878 \times 10^{-7}$ |
| 46 | $1.463 \times 10^{-6}$ |
| 47 | $4.878 \times 10^{-7}$ |
| 48 | $1.707 \times 10^{-6}$ |
| 49 | $2.195 \times 10^{-7}$ |
| 50 | $4.878 \times 10^{-6}$ |
| 51 | $3.415 \times 10^{-7}$ |
| 52 | $7.317 \times 10^{-6}$ |
| 53 | $1.463 \times 10^{-6}$ |
| 54 | $6.585 \times 10^{-6}$ |
| 55 | $4.878 \times 10^{-7}$ |
| 56 | $4.878 \times 10^{-6}$ |
| 57 | $4.878 \times 10^{-7}$ |
| 58 | $1.22 \times 10^{-6}$ |
| 59 | $1.951 \times 10^{-7}$ |
| 60 | $9.756 \times 10^{-7}$ |
| 61 | 0 |
| 62 | $2.439 \times 10^{-7}$ |
| 63 | $9.756 \times 10^{-8}$ |
| 64 | $4.878 \times 10^{-7}$ |
| 65 | $7.317 \times 10^{-8}$ |
| 66 | $4.878 \times 10^{-7}$ |
| 67 | $9.756 \times 10^{-8}$ |
| 68 | $2.439 \times 10^{-7}$ |
| 69 | $4.878 \times 10^{-8}$ |
| 70 | $1.951 \times 10^{-7}$ |
| 71 | $4.878 \times 10^{-8}$ |
| 72 | $1.951 \times 10^{-7}$ |
| 73 | $2.195 \times 10^{-8}$ |
| 74 | $2.439 \times 10^{-7}$ |
| 75 | $4.878 \times 10^{-8}$ |
| 76 | $7.317 \times 10^{-7}$ |
| 77 | $7.317 \times 10^{-7}$ |
| 78 | $1.463 \times 10^{-6}$ |

TABLE S8-continued

| Scale factors SF for atomic species with IZ ≧ 3 | |
|---|---|
| Atomic Number | Scale Factor |
| 79 | $2.439 \times 10^{-7}$ |
| 80 | $2.439 \times 10^{-7}$ |
| 81 | $2.195 \times 10^{-7}$ |
| 82 | $2.439 \times 10^{-6}$ |
| 83 | $1.463 \times 10^{-7}$ |
| 84 | 0 |
| 85 | 0 |
| 86 | 0 |
| 87 | 0 |
| 88 | 0 |
| 89 | 0 |
| 90 | $4.878 \times 10^{-8}$ |
| 91 | 0 |
| 92 | $2.927 \times 10^{-8}$ |
| 3 | 0 |
| 4 | 0 |

As embodied in preferred CREME96 software according to the invention, this routine is run for each atomic species in the solar heavy ion flux, and for each value of kinetic energy in the solar heavy ion flux. To determine the total solar heavy ion flux, the fluxes for each kinetic energy of each species are added together.

Internet Implementation

The preferred CREME96 software embodiment of the present invention is large and complex. Moreover, it is anticipated that as models used in the software are improved and/or updated, it will be necessary to perform maintenance on this software. Accordingly, as noted supra, a preferred embodiment of the invention includes a network interface for allowing remote users to access and run the software. Since the internet is a stateless system, a user does not maintain a connection to the server as users in a client-server environment would. One of the goals of the internet implementation of the present invention was to provide users with as much of the functionality of a client-server based system as possible in the stateless system of the internet.

The preferred system for allowing a large number of users to remotely access and run software such as CREME96 is a system connected to the internet, or equivalently a system connected to an intranet. Accordingly, the preferred embodiment of the invention is a server computer (or equivalently, a plurality of server computers connected in parallel) with the CREME96 software, with PERL script software (or equivalently Java scripts, or scripts written in some other script language) for controlling input to and output from the CREME96 software, as well as other functions, and with listener software and other hardware and software necessary to permit remote users with internet access to access the Creme96 software through their respective web browsers. Listings for the preferred software according to the invention are found infra.

Referring to FIG. 10, this figure shows a main menu for the preferred CREME96 software according to the invention. This menu may be accessed through the CREME96 web site maintained at the Naval Research Laboratory. This page is generated by a PERL script in response to a registered user transmitting to the server a valid username and password. The PERL script will compare the transmitted username and password to a list stored on the server, and if a matching entry is found, the script will generate a CREME96 main menu page customized for that user.

One of the advantages of CREME96 over other web-based applications is that it stores information for each user on the server. This obviates the need for cookies or other downloads to the user's computer. Many users find the downloading of cookies to be objectionable. Moreover, keeping this information on the server may speed up overall operation, because there is no need for the server to download this information to the user, and the user to subsequently upload it to the server. Thus, when a user enters a valid username and password, the script will search a section of the hard drive set aside for that user for any User Request Files (URFs). The user will then be able to pick any of the user's previously stored URFs to use as a data file for a selected routine.

The user has the option, from this main menu, of either running one or more modeling routines, using a selected URF, editing or creating an URF, or running utilities.

The available routines include the GTRN routine for calculating a geomagnetic transmission function as described supra, the FLUX routine for calculating a flux of SEU-inducing particles, as described supra, the TRANS routine for calculating the transmission of SEU-inducing particles through solid shielding, as described supra, the LETSPEC routine for calculating the linear energy transfer of charged particles to electronic devices, as described supra, and the PUP and HUP routines for calculating the SEU rates for electronic devices exposed to SEU-inducing particles.

The user will select routines to run by clicking a check box next to each of the routines to be run, and picking an URF for each routine to be run from the list of URFs that user has previously stored for that routine. When the user sends this message to the server, by pressing the GO button, a script will generate a system command to run each of these selected routines, using the selected URF as an input file for that routine. As persons of ordinary skill in the art will recognize, a system command is a computer command at the system level. In this case, the system command is to run a program with specified inputs.

Alternatively, if the user select a radio button next to one of these routines and clicks the GO button, this message from the user will trigger a script to generate and transmit to the user an HTML page with inputs for the data fields in the corresponding URF. If the user has first specified an existing (i.e., stored on the server) URF, the values for the fields in this URF will be included in the generated HTML page, allowing the user to edit the values for the fields in the URF. The URF file name is included in the URF fields, thereby providing the convenience of creating a new URF derived from editing a previous URF, and allowing file storage of both the original and modified URF.

One of the features of the preferred embodiment of the invention is the connectivity between the routines. Referring back to FIG. 1, one sees that the modules of the software are typically executed in the indicated order. In the preferred embodiment, the modules receive input in the form of a URF. The modules also receive input from a file generated by the preceding module (this file specified by the URF), and/or send output to a file for use by the subsequent module (this file likewise specified by the URF). For instance, the GTRN module will generate a .GT* output file. The FLUX module may use this .GT* file as an input, and will output a .FLX output file. The TRANS module will typically use a .FLX file as an input, and output a .TFX file. The LETSPEC module will typically use a .TFX file (or optionally a .FLX file) as an input, and will output a .LET file. The PUP module will typically use a .TFX file (or optionally a .FLX file) as an input, and will output a .PUP proton-induced upset report file. The HUP module will use a .LET file as an input, and will output a .HUP direct ionization induced upset report file.

Accordingly, by specifying a URF for each of these routines, selecting each of these routines to run, and clicking the GO buttion, a user will send a message to the server that will cause the scripts to run each of these routines in order, using the outputs from the preceding routines and generating inputs for the subsequent routines. The result of these calculations will be estimates of the single event upset rates for the specified electronics in the specified orbit under the specified conditions. The scripts will generate and transmit an HTML page with these results to the user, who may then use the utilities to download the results, create plots, or perform other functions.

Having decribed the invention, the following examples are given to illustrate specific applications of the invention, including the best mode now known to perform the invention. These specific examples are not intended to limit the scope of the invention described in this application.

EXAMPLE 1

CREME96

Obviously, many modifications and variations of the present invention are possible in light of the above teachings. It is therefore to be understood that, within the scope of the appended claims, the invention may be practiced otherwise than as specifically described.

What is claimed is:

1. A method for determining a geomagnetic transmission function for the transmission of a population of particles, said particles having one or more rigidities, to a satellite in a known earth orbit, under known geomagnetic conditions, comprising the steps:

(A) dividing said orbit into a plurality of sequential steps comprising at least a first step and a last step, each sequential pair of said steps being connected at a point, each of said points corresponding to a position of said satellite along said orbit, and specifying a value for Kp and a value for Dst to specify said geomagnetic conditions;

(B) for a plurality of said points, selecting a plurality of arrival directions for the arrival of said particles at said satellites, wherein each of said arrival directions represents either an allowed or a forbidden trajectory of one of said particles; and (C) for each of said arrival directions at each of said plurality of said points, determining whether said arrival direction represents an allowed or a forbidden trajectory by tracing a path of said particle to arrive at said point with said arrival direction, until said particle path intersects a boundary of earth's magnetosphere, thereby indicating an allowed trajectory, or until said particle path intersects either earth's atmosphere or earth's surface, thereby indicating a forbidden trajectory, wherein said tracing of said path is performed by integrating in the time domain the Lorentz equation $$F=m\gamma dv/d(-t')=-Qv\times B$$

wherein F is the force vector acting on said particle, m is mass $\gamma$ is $1/(1-v^2/c^2)^{-1/2}$, v is said particle's velocity vector, t' is the travel time of said particle, Q is the charge of said particle, and B is the magnetic field vector acting on said particle, wherein B is given by $$B=B_{IGRF}(r,t')+B_{TSYG}(Kp,r,t')$$

where $B_{IGRF}$ is the International Geomagnetic Reference Field promulgated by the International Association of Geomagnetism and Aeronomy, and $B_{TSYG}$ is the modified Tsyganenko field given by the sum of $B_{Xmg}^{(T)}+B_{Ymg}^{(T)}+B_{Zmg}^{(T)}+B_{Xmg}^{(RC)}+B_{Ymg}^{(RC)}+B_{Zmg}^{(RC)}+B_{Xsm}^{(C)}+B_{Ysm}^{(C)}+B_{Zsm}^{(C)}+B_{Xsm}^{(M)}+B_{Ysm}^{(M)}+B_{Zsm}^{(M)}$, wherein coordinates in the solar magnetospheric system are denoted sm, and wherein coordinates in the solar magnetic coordinate system are denoted mg; and wherein $$B_X^{(T)}=Q_t \text{ x } z_r;$$

$$B_Y^{(T)}=Q_t \text{ y } z_r;$$

$$B_Z(T)=\frac{W(x,y)}{S_T}\left(C_1+C_2\frac{a_T+\xi_T}{S_T^2}\right)+\frac{x\frac{\partial W}{\partial x}+y\frac{\partial W}{\partial y}}{S_T+a_T+\xi_T}\times\left(C_1+\frac{C_2}{S_T}\right)+B_x(T)\frac{\partial z_s}{\partial x}+B_Y(T)\frac{\partial z_s}{\partial y}-Q_TD_T\left(x\frac{\partial D_T}{\partial x}+y\frac{\partial D_T}{\partial y}\right)$$

wherein $$W(x,y)=0.5\left(1-\frac{x-x_0}{[(x-x_0)^2+D_x^2]^{\frac{1}{2}}}\right)\times\left(1+\frac{y^2}{D_y^2}\right)^{-1}$$

wherein $$Q_T=\frac{W(x,y)}{\xi_TS_T}\left[\frac{C_1}{S_T+a_T+x_T}+\frac{C_2}{S_T^2}\right];$$

wherein $z_r=z-z_s(x,y,\psi)$, $$z_s(x,y,\psi)=0.5\tan\psi\left(x+R_c-\sqrt{(x+R_c)^2+16}\right)-G\sin\psi\cdot y^4(y^4+L_y^4)^{-1},$$

wherein $$S_{T,RC}=\sqrt{\rho^2+(a_{T,RC}+\xi_{T,RC})^2},$$

$$\xi_{T,RC}=\sqrt{z_r^2+D_{T,RC}^2},$$

$$D_T=D_0+\delta y^2+\gamma_Th_T(x)+\gamma_1h_1(x),$$

wherein $C_1=-98.72$ when Kp=0, $0^+$, $C_1=-35.64$ when Kp=$1^-$,1,$1^{30}$, $C_1-77.45$ when Kp=$2^-$,2,$2^+$, $C_1=-70.12$ when Kp=$3^-$,3,$3^{30}$, $C_1=-162.5$ when Kp=$4^-$,4,$4^+$, $C_1=-128.4$ when Kp$\geqq 5^-$, wherein $C_2=-10014$ when Kp=0, $0^+$, $C_2=-12800$ when Kp=$1^-$,1,$1^+$, $C_2=-14588$ when Kp=$2^-$,2,$2^+$, $C_2=-16125$ when Kp=$3^-$,3,$3^+$, $C_2=-15806$ when Kp=$4^-$,4,$4^+$, $C_2=-16184$ when Kp$\geqq 5^-$, wherein $a_T=13.55$ when Kp=0,$0^+$, $a_T=13.81$ when Kp=$1^-$,1,$1^+$, $a_T=15.08$ when Kp=$2^-$,2,$2^+$, $a_T=15.63$ when Kp=$3^-$,3,$3^+$, $a_T=16.11$ when Kp=$4^-$,4,$4^+$, $a_T=15.85$ when Kp$\geqq 5^-$, wherein $D_0=2.08$ when Kp=0, $0^+$, $D_0=1.664$ when Kp=$1^{31}$,1,$1^+$, $D_0=1.541$ when Kp=$2^-$,2,$2^+$, $D_0=0.9351$ when Kp=$3^-$,3,$3^+$, $D_0=0.7677$ when Kp=$4^-$,4,$4^+$, $D_0=0.3325$ when Kp$\geqq 5^-$, wherein $R_c=9.084$ when Kp=0, $0^+$, $R_c=9.238$ when Kp=$1^-$, 1,$1^+$, $R_c=9.609$, when Kp=$2^-$,2,$2^+$, $R_c=8.573$ when Kp=$3^-$,3,$3^+$, $R_c=10.06$ when Kp=$4^-$,4,$4^+$, $R_c=10.47$ when Kp$\geqq 5^-$, wherein $L_y=10\ R_E$, $$B_x^{(RC)}=Q_{RC}xz_r;$$

$$B_Y^{(RC)}=Q_{RC}yz_r;$$

$$B_Z^{(RC)} = C_5 \frac{2(a_{RC} + \xi_{RC})^2 - \rho^2}{S_{RC}^5} + B_X^{RC} \frac{\partial z_s}{\partial x} + B_Y^{RC} \frac{\partial z_s}{\partial y} - Q_{RC} D_{RC} x \frac{\partial D_{RC}}{\partial x};$$

wherein $Q_{RC}=3C_5\xi_{RC}^{-1}S_{RC}^{-5}(a_{RC}+\xi_{RC})$ $D_{RC}=D_0+\gamma_{RC}h_{RC}(x)+\gamma_1 h_1(x)$ $h_{T,RC}=0.5[1+x(x^2+L^2_{T,RC})^{-1/2}]$, $h_1=0.5\{1-(x+16)[(x+16)^2+36]^{-1/2}\}$, $C_5(\text{Dst})=-10220+408.5\cdot\text{Dst}$ $$B_{XYZ}^{(C)}=C_3(F^+_{x,y,z}+F^-_{x,y,z})+C_4(F^+_{x,y,z}-F^-_{x,y,z}),$$

wherein $$\begin{Bmatrix} F_x^{\pm} \\ F_y^{\pm} \end{Bmatrix} = \pm \frac{W_c(x, y)}{S^{\pm}[S^{\pm} \pm (z \pm R_T)]} \times \begin{Bmatrix} x \\ y \end{Bmatrix},$$

$$F_z^{\pm} = \frac{W_c(x, y)}{S^{\pm}} + \left(x\frac{\partial W_c}{\partial x} + y\frac{\partial W_c}{\partial y}\right) \times \frac{1}{S^{\pm} \pm (z \pm R_T)},$$

$$S^{\pm} = [(z \pm R_T)^2 + x^2 + y^2]^{\frac{1}{2}},$$

$$W_c(x, y) = 0.5\left[1 - \frac{x - x_{0c}}{[(x - x_{0c})^2 + L_{xc}^2]^{\frac{1}{2}}}\right] \times (1 + y^2 / D_{yc}^2)^{-1};$$

$$B_X^{(M)}=e^{x/\Delta x}[C_6 z \cos\psi+(C_7+C_8y^2+C_9z^2)\sin\psi],$$

$$B_Y^{(M)}=e^{x/\Delta x}[C_{10}yz \cos\psi+(C_{11}y+C_{12}y^3+C_{13}yz^2)\sin\psi],$$

and $$B_Z^{(M)}=e^{x/\Delta x}[(C_{14}+C_{15}y^2+C_{16}z^2)\cos\psi+(C_{17}z+C_{18}zy^2+C_{19}z^3)\sin\psi],$$

wherein $C_6$ through $C_{19}$ are given by:

| | Kp | | |
|---|---|---|---|
| $C_n$ | = 0, $0^+$ | = $1^-$, 1, $1^+$ | = $2^-$, 2, $2^+$ |
| $C_6$ | 1.813 | 2.316 | 2.641 |
| $C_7$ | 31.10 | 35.64 | 42.46 |
| $C_8$ | −0.07464 | −0.0741 | −0.07611 |
| $C_9$ | −.07764 | −0.1081 | −0.1579 |
| $C_{10}$ | 0.003303 | 0.003924 | 0.004078 |
| $C_{11}$ | −1.129 | −1.451 | −1.391 |
| $C_{12}$ | 0.001663 | 0.00202 | 0.00153 |
| $C_{13}$ | 0.000988 | 0.00111 | 0.000727 |
| $C_{14}$ | 18.21 | 21.37 | 21.86 |
| $C_{15}$ | −0.03018 | −0.04567 | −0.04199 |
| $C_{16}$ | −0.03829 | −0.05382 | −0.06523 |
| $C_{17}$ | −0.1283 | −0.1457 | −0.6412 |
| $C_{18}$ | −0.001973 | −0.002742 | −0.000948 |
| $C_{19}$ | 0.000717 | 0.001244 | 0.0002276 |

| | Kp | | |
|---|---|---|---|
| $C_n$ | = $3^-$, 3, $3^+$ | = $4^-$, 4, $4^+$ | $\geqq 5^-$ |
| $C_6$ | 3.181 | 3.607 | 4.090 |
| $C_7$ | 47.50 | 51.10 | 49.09 |
| $C_8$ | −0.1327 | −0.1006 | −0.0231 |
| $C_9$ | −0.1864 | −0.1927 | −0.1359 |
| $C_{10}$ | 0.01382 | 0.03353 | 0.01989 |
| $C_{11}$ | −1.488 | −1.392 | −2.298 |
| $C_{12}$ | 0.002962 | 0.001594 | 0.004911 |
| $C_{13}$ | 0.000897 | 0.002439 | 0.003421 |
| $C_{14}$ | 22.74 | 22.41 | 21.79 |
| $C_{15}$ | −0.04095 | −0.04925 | −0.05447 |

-continued

| | | | |
|---|---|---|---|
| $C_{16}$ | −0.09223 | −0.1153 | −0.1149 |
| $C_{17}$ | −1.059 | −1.399 | −0.2214 |
| $C_{18}$ | −0.001766 | 0.000716 | −0.01355 |
| $C_{19}$ | 0.003034 | 0.002696 | 0.001185 |

and wherein $L_y$=10.0, $D_x$=13.0, $L_{RC}$=5.0, $L_T$=6.30, $\gamma_T$=4.0, $\delta$=0.010, $\gamma_1$=1.0, $R_T$=30.0, $x_{0c}$=4.0, $L_{xc}^2$=50.0, and $D_{yc}$=20.0, and thereby determining whether said particle's trajectory intersects either the boundary of earth's magnetosphere, thereby indicating an allowed trajectory, or intersecting earth's surface or earth's atmosphere, thereby indicating a forbidden trajectory.

2. The method of claim 1, wherein said plurality of arrival directions comprises one or more randomly or pseudorandomly selected arrival directions.

3. The method of claim 1, further comprising the step:

(D) for each particle rigidity, determine what fraction of particles of that rigidity will be transmitted to said satellite.

4. The method of claim 1, wherein said plurality of points comprises a complete set of points for said orbit.

5. The method of claim 1, wherein said plurality of points comprises a set of points for a portion of said orbit.

6. A method for determining, for a given particle environment outside of earth's magnetosphere, what portion of a population of particles having one or more rigidities making up said particle environment will be transmitted to a satellite in a known earth orbit, comprising the steps:

performing steps (A) through (C) of claim 1, thereby computing a geomagnetic transmission function for said population of particles; and applying said geomagnetic transmission function to said population of particles, thereby determining what portion of that population of particles will be transmitted to said satellite.

7. A method for determining, for a given particle environment outside of earth's magnetosphere, what portion of a population of particles having one or more rigidities making up said particle environment will be transmitted to a satellite in earth orbit, comprising the steps:

prompting a user to specify an earth orbit;

determining whether said orbit is among a group of preselected orbits, each of said orbits in said preselected group of orbits having an associated predetermined geomagnetic transmission function for a range of particle rigidities, each of said predetermined geomagnetic transmission functions having been prepared in accordance with claim 1; and for the case wherein said orbit is among said preselected group of orbits, applying said predetermined geomagnetic transmission function for said orbit to said particle environment outside earth's magnetosphere.

8. The method of claim 7, wherein said preselected group of orbits comprises a quiet shuttle orbit having a 450 km altitude and a 28.5° inclination, a disturbed shuttle orbit having a 450 km altitude and a 28.5° inclination, a quiet space station orbit having a 450 km altitude and a 51.6° inclination, and a disturbed space station orbit having a 450 km altitude and a 51.6° inclination, wherein said quiet shuttle orbit has a geomagnetic transmission function given by FIG. 4, wherein said disturbed shuttle orbit has a geomagnetic transmission function given by FIG. 5, wherein said quiet space station orbit has a geomagnetic transmission function given by FIG. 6, and wherein said disturbed space station orbit has a geomagnetic transmission function given by FIG. 7.

9. The method of claim 7, further comprising the step:

for the case wherein said orbit is not among said preselected group of orbits, performing a step selected from the group consisting of (a) returning an error message to a user, and (b) computing a geomagnetic transmission function for said orbit, in accordance with the method of claim 1.

10. A method for determining a flux of a species of solar ions having a specified atomic number between 3 and 92, and a specified kinetic energy, for a satellite in a near earth orbit, comprising the steps:

(A) specifying an atomic number for solar ions for evaluation;

(B) specifying a kinetic energy for said solar ions;

(C) specifying a baseline model for said flux of solar ions, wherein said baseline model is selected from the group consisting of a worst day model, a worst week model, and a peak flux model;

(D) in the case wherein said specified atomic number is greater than 20, selecting iron as an elemental spectrum model;

(E) in the case wherein said specified atomic number is less than or equal to 20, selecting oxygen as an elemental spectrum model;

(F) looking up a value for an elemental breakpoint, wherein said elemental breakpoint is a function of said elemental spectrum model and said baseline model, and wherein said elemental breakpoint is selected from the table:

| Elemental spectrum model | Baseline model: worst day or peak flux | Baseline model: worst week |
|---|---|---|
| iron | 24.23 MeV/nuc | 19.90 MeV/nuc |
| oxygen | 15.94 MeV/nuc | 12.89 MeV/nuc |

(G) in the case wherein said baseline model is said worst week model, and said elemental spectrum model is iron, and said kinetic energy is greater than 127.93 MeV/nuc, calculating an unscaled flux, wherein said unscaled flux equals $A_{sp}\times(En/MeV/nuc)^{-Gsp}$, wherein $A_{sp}=3.16814\times10^6$ $(cm^2 sr\ MeV/nuc)^{-1}$, (En/MeV/nuc) is said kinetic energy, normalized to be dimensionless, and $G_{sp}=2.861$;

(H) in the case wherein the condition recited in step (G) is not satisfied, and wherein said kinetic energy is greater than said elemental breakpoint, calculating an unscaled flux wherein said unscaled flux equals $A_3\times EN^{\gamma si}$, wherein $A_3$ is a function of said elemental spectrum model and said baseline model, and wherein said $A_3$ is selected from the table:

| Elemental spectrum model | Baseline model: worst day or peak flux in $(cm^2\ sr\ MeV/nuc)^{-1}$ | Baseline model: worst week in $(cm^2\ sr\ MeV/nuc)^{-1}$ |
|---|---|---|
| iron | $0.252948\times10^{10}$ | $0.249719\times10^{9}$ |
| oxygen | $0.106702\times10^{10}$ | $0.667628\times10^{9}$ |

and wherein $\gamma_{si}$ is a spectral index and is a function of said elemental spectrum model and said baseline model, and wherein said $\gamma_{si}$ is selected from the table:

| Elemental spectrum model | Baseline model: worst day or peak flux | Baseline model: worst week |
|---|---|---|
| iron | −4.52970 | −3.7610 |
| oxygen | −4.14060 | −3.76850 |

(I) in the case wherein the condition recited in step (G) is not satisfied, and wherein said kinetic energy is less than or equal to said elemental breakpoint, calculating an unscaled flux wherein said unscaled flux equals $A_2\exp(-G\times En^{1/4})\times En^{1/4}$, wherein $A_2$ is a function of said elemental spectrum model and said baseline model, and wherein said $A_2$ is selected from the table:

| Elemental spectrum model | Baseline model: worst day or peak flux in $(cm^2\ sr\ MeV/nuc)^{-1}$ | Baseline model: worst week in $(cm^2\ sr\ MeV/nuc)^{-1}$ |
|---|---|---|
| iron | $1.8991\times10^{8}$ | $3.0372\times10^{8}$ |
| oxygen | $4.9518\times10^{8}$ | $1.1307\times10^{9}$ |

and wherein $G_{si}$ is a spectral index and is a function of said elemental spectrum model and said baseline model, and wherein said $G_{si}$ is selected from the table:

| Elemental spectrum model | Baseline model: worst day or peak flux | Baseline model: worst week |
|---|---|---|
| iron | 5.70 | 5.70 |
| oxygen | 5.70 | 5.70 |

; and (J) in the case where said atomic number is between 3 and 92, inclusive, calculating a solar ion flux for said specified atomic number and said specified kinetic energy by multiplying said unscaled flux by a scale factor ratio, said scale factor ratio being the ratio of a scale factor for an element having said selected atomic number over a scale factor for said spectrum model element, wherein said scale factors are selected from the table:

| Atomic Number | Scale Factor |
|---|---|
| 5 | 0 |
| 6 | $4.704\times10^{-1}$ |
| 7 | $1.2059\times10^{-1}$ |
| 8 | 1 |
| 9 | $4.560976\times10^{-5}$ |
| 10 | $2.1312\times10^{-1}$ |
| 11 | $1.744715\times10^{-2}$ |
| 12 | $2.0624\times10^{-1}$ |
| 13 | $1.826829\times10^{-2}$ |
| 14 | $3.5935\times10^{-1}$ |
| 15 | $2.279675\times10^{-4}$ |
| 16 | $9.758\times10^{-2}$ |
| 17 | $1.680488\times10^{-4}$ |
| 18 | $1.771545\times10^{-3}$ |
| 19 | $3.644715\times10^{-4}$ |
| 20 | $4.826\times10^{-2}$ |
| 21 | $2.929\times10^{-4}$ |

-continued

| Atomic Number | Scale Factor |
|---|---|
| 22 | $4.377 \times 10^{-3}$ |
| 23 | 4.088 |
| 24 | $1.65 \times 10^{-2}$ |
| 25 | $5.625 \times 10^{-3}$ |
| 26 | 1 |
| 27 | $1.303 \times 10^{-2}$ |
| 28 | $3.172 \times 10^{-2}$ |
| 29 | $3.048 \times 10^{-4}$ |
| 30 | $7.457 \times 10^{-4}$ |
| 31 | $4.878 \times 10^{-5}$ |
| 32 | $1.22 \times 10^{-4}$ |
| 33 | $7.317 \times 10^{-6}$ |
| 34 | $7.317 \times 10^{-5}$ |
| 35 | $9.756 \times 10^{-6}$ |
| 36 | $4.878 \times 10^{-5}$ |
| 37 | $7.317 \times 10^{-6}$ |
| 38 | $2.439 \times 10^{-5}$ |
| 39 | $4.878 \times 10^{-6}$ |
| 40 | $1.22 \times 10^{-5}$ |
| 41 | $9.756 \times 10^{-7}$ |
| 42 | $4.878 \times 10^{-6}$ |
| 43 | 0 |
| 44 | $2.195 \times 10^{-6}$ |
| 45 | $4.878 \times 10^{-7}$ |
| 46 | $1.463 \times 10^{-6}$ |
| 47 | $4.878 \times 10^{-7}$ |
| 48 | $1.707 \times 10^{-6}$ |
| 49 | $2.195 \times 10^{-7}$ |
| 50 | $4.878 \times 10^{-6}$ |
| 51 | $3.415 \times 10^{-7}$ |
| 52 | $7.317 \times 10^{-6}$ |
| 53 | $1.463 \times 10^{-6}$ |
| 54 | $6.585 \times 10^{-6}$ |
| 55 | $4.878 \times 10^{-7}$ |
| 56 | $4.878 \times 10^{-6}$ |
| 57 | $4.878 \times 10^{-7}$ |
| 58 | $1.22 \times 10^{-6}$ |
| 59 | $1.951 \times 10^{-7}$ |
| 60 | $9.756 \times 10^{-7}$ |
| 61 | 0 |
| 62 | $2.439 \times 10^{-7}$ |
| 63 | $9.756 \times 10^{-8}$ |
| 64 | $4.878 \times 10^{-7}$ |
| 65 | $7.317 \times 10^{-8}$ |
| 66 | $4.878 \times 10^{-7}$ |
| 67 | $9.756 \times 10^{-8}$ |
| 68 | $2.439 \times 10^{-7}$ |
| 69 | $4.878 \times 10^{-8}$ |
| 70 | $1.951 \times 10^{-7}$ |
| 71 | $4.878 \times 10^{-8}$ |
| 72 | $1.951 \times 10^{-7}$ |
| 73 | $2.195 \times 10^{-8}$ |
| 74 | $2.439 \times 10^{-7}$ |
| 75 | $4.878 \times 10^{-8}$ |
| 76 | $7.317 \times 10^{-7}$ |
| 77 | $7.317 \times 10^{-7}$ |
| 78 | $1.463 \times 10^{-6}$ |
| 79 | $2.439 \times 10^{-7}$ |
| 80 | $2.439 \times 10^{-7}$ |
| 81 | $2.195 \times 10^{-7}$ |
| 82 | $2.439 \times 10^{-6}$ |
| 83 | $1.463 \times 10^{-7}$ |
| 84 | 0 |
| 85 | 0 |
| 86 | 0 |
| 87 | 0 |
| 88 | 0 |
| 89 | 0 |
| 90 | $4.878 \times 10^{-8}$ |
| 91 | 0 |
| 92 | $2.927 \times 10^{-8}$ |
| 3 | 0 |
| 4 | 0 |

wherein elements having atomic number of 20 or less are scaled to oxygen, and elements having higher atomic numbers are scaled to iron.

11. A method for determining a flux of solar ions of species having a range of atomic numbers between 3 and 92, wherein each of said species includes particles having a range of specified kinetic energies, for a satellite in a near earth orbit, comprising the steps:

(A) for each kinetic energy of each of said species, performing steps (A) through (K) of claim 10, and storing a flux value for each of said kinetic energies for each of species; and (B) adding each of said flux values to obtain a total solar ion flux value.

12. A method for modeling the effects of cosmic rays on microelectronics on a computer connected to the internet, comprising the steps:

(A) receiving a login message from a remote user connected to the internet, and generating and transmitting back to said user with a script in response thereto an HTML main menu page, wherein said main menu page comprises prompts for said user to run one or more routines selected from the group consisting of: (1) a routine for calculating a geomagnetic transmission function for SEU-inducing particles, (2) a routine for calculating a flux of SEU-inducing particles in the near earth environment or in the environment shielded by earth's magnetosphere, (3) a routine for calculating a solid shielding transport function for SEU-inducing particles, (4) a routine for calculating a proton induced single event upset rate, (5) a routine for calculating a linear energy transfer rate, and (6) a routine for calculating a heavy ion induced single even upset rate, said main menu page futher comprises prompts for said user to select a user request file for each of said routines;

(B) in response to a message from said user to run at least one of said routines, using a user request file specified by said user, generating and executing with a script a system command for said computer to run each of said specified routines; and (C) in response to the completion of all of said routines specified by said user, generating and transmitting to said user with a script an HTML page notifying said user of said completion.

13. The method of claim 12, wherein said main menu page generated and transmitted to said user further comprises prompts for said user to create or edit a user request file for any one of said routines, in lieu of running said one or more of said routines, and further comprising the step:

(D) in response to a message from said user to create or edit a user request file, generating and transmitting to said user with a script an HTML page with prompts for the entry of fields for said user request file; and (E) in response to said user transmitting information for said user request file, storing said information in a user request file with a script.

* * * * *